(12) United States Patent
Takeuchi

(10) Patent No.: US 11,962,287 B2
(45) Date of Patent: Apr. 16, 2024

(54) ACOUSTIC WAVE FILTER

(71) Applicant: Murata Manufacturing Co., Ltd., Nagaokakyo (JP)

(72) Inventor: Yuta Takeuchi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 335 days.

(21) Appl. No.: 17/582,591

(22) Filed: Jan. 24, 2022

(65) Prior Publication Data

US 2022/0149818 A1 May 12, 2022

Related U.S. Application Data

(63) Continuation of application No. PCT/JP2020/028220, filed on Jul. 21, 2020.

(30) Foreign Application Priority Data

Jul. 25, 2019 (JP) .................................. 2019-136883

(51) Int. Cl.
*H03H 9/64* (2006.01)
*H03H 9/02* (2006.01)
(Continued)

(52) U.S. Cl.
CPC .......... *H03H 9/64* (2013.01); *H03H 9/02992* (2013.01); *H03H 9/13* (2013.01); *H03H 9/145* (2013.01)

(58) Field of Classification Search
CPC ........ H03H 9/64; H03H 9/02992; H03H 9/13; H03H 9/145; H03H 9/14552;
(Continued)

(56) References Cited

U.S. PATENT DOCUMENTS 10,958,246 B2* 3/2021 Miyamoto ........... H03H 9/6483
2017/0099043 A1* 4/2017 Goto .................... H03H 9/725
(Continued)

FOREIGN PATENT DOCUMENTS

JP   2013-247569 A   12/2013
WO   2016/104598 A1   6/2016
(Continued)

OTHER PUBLICATIONS

Official Communication issued in International Patent Application No. PCT/JP2020/028220, dated Sep. 24, 2020.

*Primary Examiner* — John W Poos
(74) *Attorney, Agent, or Firm* — Keating & Bennett, LLP

(57) ABSTRACT

An acoustic wave filter includes series arm resonators and parallel arm resonators each including an acoustic wave resonator including an IDT electrode including a pair of comb-shaped electrodes each including electrode fingers and a busbar electrode. An electrode finger connected to neither of the busbar electrodes of the pair of comb-shaped electrodes is a floating withdrawal electrode, and of all the electrode fingers of the pair of comb-shaped electrodes, the electrode finger that is connected to a same busbar electrode to which the electrode fingers on both sides thereof are connected is a polarity-reversing withdrawal electrode, and, of the series arm resonators, the series arm resonator having a lowest anti-resonant frequency includes an IDT electrode including the floating withdrawal electrodes, and the series arm resonator includes an IDT electrode including the polarity-reversing withdrawal electrodes.

20 Claims, 15 Drawing Sheets

(51) Int. Cl.
  *H03H 9/13* (2006.01)
  *H03H 9/145* (2006.01)
(58) Field of Classification Search
  CPC .............. H03H 9/1457; H03H 9/6483; H03H 9/02574; H03H 9/14541
  See application file for complete search history.

(56) References Cited

U.S. PATENT DOCUMENTS

| | | |
|---|---|---|
| 2017/0359051 A1 | 12/2017 | Urata |
| 2019/0036554 A1* | 1/2019 | Ito .................... H03H 9/14582 |
| 2019/0058452 A1* | 2/2019 | Takata ............... H03H 9/02818 |
| 2020/0091892 A1 | 3/2020 | Watanabe et al. |
| 2020/0280303 A1* | 9/2020 | Takamine ............ H03H 9/6479 |

FOREIGN PATENT DOCUMENTS

| | | |
|---|---|---|
| WO | 2017/131170 A1 | 8/2017 |
| WO | 2018/216417 A1 | 11/2018 |
| WO | 2019/111902 A1 | 6/2019 |

\* cited by examiner

ACOUSTIC WAVE FILTER

CROSS REFERENCE TO RELATED APPLICATIONS

This application claims the benefit of priority to Japanese Patent Application No. 2019-136883 filed on Jul. 25, 2019 and is a Continuation Application of PCT Application No. PCT/JP2020/028220 filed on Jul. 21, 2020. The entire contents of each application are hereby incorporated herein by reference.

BACKGROUND OF THE INVENTION

1. Field of the Invention

The present invention relates to acoustic wave filters.

2. Description of the Related Art

Acoustic wave filters are used as band pass filters for use in radio frequency circuits such as communication devices and the like. From the viewpoint of effective use of frequency resources for radio communications, many frequency bands are assigned to communication bands of mobile phones and the like, and this results in gaps between adjacent frequency bands narrower. In view of such a situation regarding the assignment of frequency bands, in acoustic wave filters, the rate of change in the insertion loss from a pass band to an attenuation band at an end portion of the pass band (hereinafter, referred to as steepness) serves as an important performance index.

In International Publication No. 2017/131170, with regard to a ladder acoustic wave filter including a plurality of series arm resonators and a plurality of parallel arm resonators, a configuration is disclosed in which an IDT (InterDigital Transducer) electrode that defines at least one of the series arm resonators and the parallel arm resonators includes withdrawal electrodes. This configuration enables an improvement in the steepness in the pass band.

However, depending on the electrode finger structure of a withdrawal electrode, the mode of change in a resonant band width (frequency difference between a resonant frequency and an anti-resonant frequency) and the modes of changes in resonant Q factors at a resonance point and an anti-resonance point of an acoustic wave resonator including the withdrawal electrode vary. Because of this, in the case where an acoustic wave filter is formed using withdrawal electrodes for some of IDT electrodes, it is difficult to ensure both steepness in the pass band and low loss in the pass band at the same time.

SUMMARY OF THE INVENTION

Preferred embodiments of the present invention provide acoustic wave filters each with improved steepness while ensuring low loss in a pass band.

An acoustic wave filter according to a preferred embodiment of the present invention includes a first input/output terminal and a second input/output terminal, a plurality of series arm resonators along a path connecting the first input/output terminal and the second input/output terminal, and one or more parallel arm resonators each between a node in the path and ground, wherein each of the plurality of series arm resonators and the one or more parallel arm resonators includes an acoustic wave resonator that includes an interdigital transducer (IDT) electrode provided on a substrate having piezoelectricity, the IDT electrode includes a pair of comb-shaped electrodes each including a plurality of electrode fingers and a busbar electrode, the plurality of electrode fingers being in parallel or substantially in parallel to one another and extending in a direction that crosses an acoustic wave propagation direction, the busbar electrode connecting one-end portions of the electrode fingers defining the plurality of electrode fingers, and of the plurality of electrode fingers, an electrode finger not connected to either one of the busbar electrodes of the pair of comb-shaped electrodes is defined as a floating withdrawal electrode, and of all of the electrode fingers of the pair of comb-shaped electrodes, an electrode finger connected to a same busbar electrode to which electrode fingers on both sides thereof are connected is defined as a polarity-reversing withdrawal electrode, of the plurality of series arm resonators, a first series arm resonator with a lowest anti-resonant frequency includes an IDT electrode including the floating withdrawal electrode, and of the plurality of series arm resonators, at least one of one or more series arm resonators other than the first series arm resonator includes an IDT electrode including the polarity-reversing withdrawal electrode.

According to preferred embodiments of the present invention, acoustic wave filters each with an improved steepness while ensuring low loss in the pass band are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
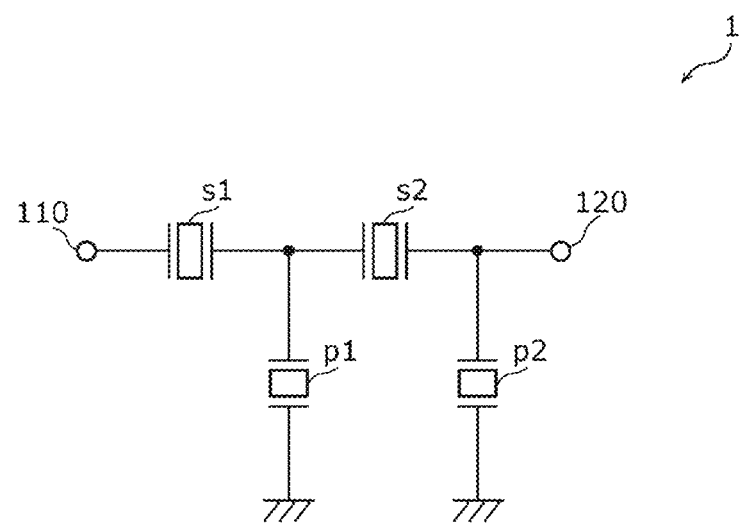
FIG. 1 is a circuit configuration diagram of an acoustic wave filter according to a preferred embodiment of the present invention.

Hereinafter, preferred embodiments of the present invention will be described in detail with reference to a working example and a modified example. The preferred embodiments which will be described below, each illustrate a comprehensive or specific example. Numeric values, shapes, materials, elements, arrangements, and connection structures of the elements, and the like illustrated in the following preferred embodiments are merely examples, and not intended to limit the present invention. Of elements in the following preferred embodiments, the elements that are not described in an independent claim will be described as optional elements. Further, sizes or ratios of the sizes of elements illustrated in the drawings are not necessarily exact.

Preferred Embodiments

1. Circuit Configuration of Acoustic Wave Filter 1

FIG. 1 is a circuit configuration diagram of an acoustic wave filter 1 according to a preferred embodiment of the present invention. As illustrated in FIG. 1, the acoustic wave filter 1 includes series arm resonators s1 and s2, parallel arm resonators p1 and p2, and input/output terminals 110 and 120.

The series arm resonators s1 and s2 are each provided along a path connecting the input/output terminal 110 (first input/output terminal) and the input/output terminal 120 (second input/output terminal) and are connected in series to each other. Further, each of the parallel arm resonators p1 and p2 is provided between a node in the path and ground.

The number of the series arm resonators being provided may be equal to or greater than 3, for example. Further, the number of parallel arm resonators being provided may be any number equal to or greater than 1.

Further, for example, a circuit element such as an inductor, a capacitor, or the like, or a longitudinally coupled resonator or the like may be inserted between the ground and the series arm resonators s1 and s2, the parallel arm resonators p1 and p2, or the input/output terminals 110 and 120.

According to the foregoing configuration, the acoustic wave filter 1 defines a ladder band pass filter.

In the following section, a basic structure of the series arm resonators and the parallel arm resonators of the acoustic wave filter 1 is described.

2. Structure of Acoustic Wave Resonator

Figure 2A:
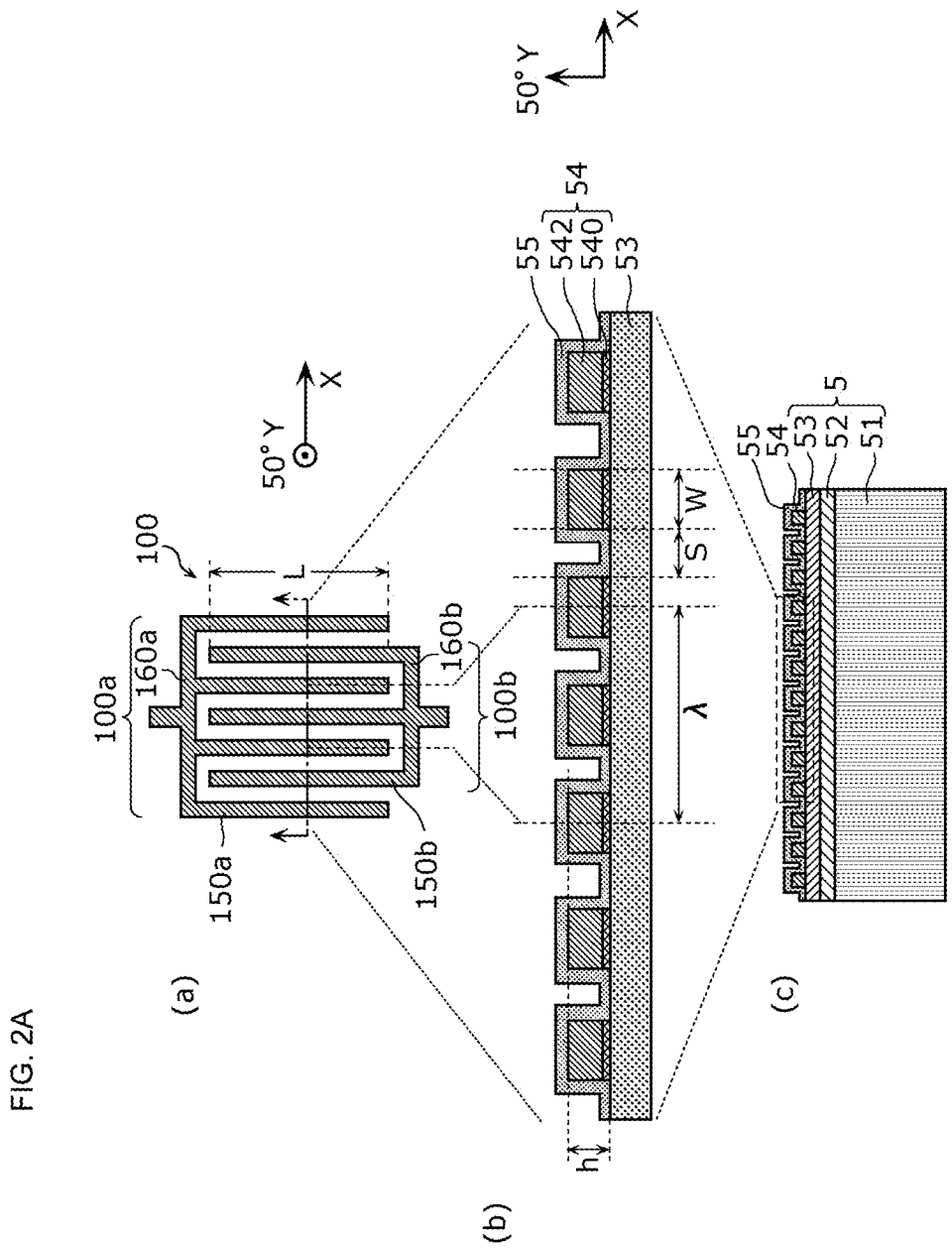
FIG. 2A shows a plan view and cross-sectional views schematically illustrating one example of an acoustic wave resonator according to a preferred embodiment of the present invention.

FIG. 2A is a schematic diagram schematically illustrating one example of an acoustic wave resonator according to a preferred embodiment of the present invention. Part (a) of FIG. 2A is a plan view, and parts (b) and (c) of FIG. 2A are cross-sectional views along a dashed-dotted line in part (a) of FIG. 2A FIG. 2A illustrates an example of an acoustic wave resonator 100 having the basic structure of the series arm resonators and the parallel arm resonators that define the acoustic wave filter 1. The acoustic wave resonator 100 illustrated in FIG. 2A is for illustrating a typical structure of the acoustic wave resonator, and the number, the lengths, and the like of electrode fingers that define an electrode are not limited thereto.

The acoustic wave resonator 100 includes a substrate 5 having piezoelectricity and comb-shaped electrodes 100a and 100b.

As illustrated in part (a) of FIG. 2A, a pair of the comb-shaped electrodes 100a and 100b, which are arranged opposite each other, are provided on the substrate 5. The comb-shaped electrode 100a includes a plurality of electrode fingers 150a that are parallel or substantially parallel to each other and a busbar electrode 160a that connects the plurality of electrode fingers 150a. Further, the comb-shaped electrode 100b includes a plurality of electrode fingers 150b that are parallel or substantially parallel to each other and a busbar electrode 160b that connects the plurality of electrode fingers 150b. The plurality of electrode fingers 150a and the plurality of electrode fingers 150b extend in a direction orthogonal or substantially orthogonal to an acoustic wave propagation direction (X axis direction).

Further, an IDT (InterDigital Transducer) electrode 54 including the plurality of electrode fingers 150a and 150b and the busbar electrodes 160a and 160b has a multilayer structure including a close contact layer 540 and a primary electrode layer 542 as illustrated in part (b) of FIG. 2A.

The close contact layer 540 improves adhesiveness between the substrate 5 and the primary electrode layer 542, and Ti is used as a material therefor, for example. The film thickness of the close contact layer 540 is, for example, about 12 nm.

As a material for the primary electrode layer 542, for example, Al including about 1% of Cu is used. The film thickness of the primary electrode layer 542 is, for example, about 162 nm.

A protective layer 55 covers the comb-shaped electrodes 100a and 100b. The protective layer 55 protects the primary electrode layer 542 from an external environment, adjusts a frequency-temperature characteristic, improves a moisture resistance property, and achieves other similar functions. For example, the protective layer 55 is a dielectric film whose main component is silicon dioxide. The film thickness of the protective layer 55 is, for example, about 25 nm.

The materials of the close contact layer 540, the primary electrode layer 542, and the protective layer 55 are not limited to the materials described above. Moreover, the IDT electrode 54 does not need to have the foregoing multilayer structure. The IDT electrode 54 may be made of, for example, a metal such as Ti, Al, Cu, Pt, Au, Ag, Pd, or the like or an alloy thereof, or, for example, may include a plurality of multilayer bodies each made of the metal or the alloy described above. Further, the protective layer 55 does not need to be provided.

Next, the multilayer structure of the substrate 5 is described.

As illustrated in part (c) of FIG. 2A, the substrate 5 includes a high acoustic velocity support substrate 51, a low acoustic velocity film 52, and a piezoelectric film 53, and has a structure in which the high acoustic velocity support substrate 51, the low acoustic velocity film 52, and the piezoelectric film 53 are stacked on top of each other in this order.

The piezoelectric film 53 is, for example, made of 50° Y-cut X-propagation LiTaO$_3$ piezoelectric single crystal or piezoelectric ceramics (lithium tantalate single crystal that is cut at a surface whose normal line is an axis obtained by rotating from the Y axis by about 50° about the X axis that defines and functions as the center axis or ceramics, wherein a surface acoustic wave propagates in the X axis direction on this single crystal or ceramics). The thickness of the piezoelectric film 53 is, for example, about 600 nm. Depending on a requirement specification of each filter, the material, and the cut angle of the piezoelectric single crystal to be used as the piezoelectric film 53 are appropriately selected.

The high acoustic velocity support substrate 51 supports the low acoustic velocity film 52, the piezoelectric film 53, and the IDT electrode 54. Moreover, the high acoustic velocity support substrate 51 is a substrate such that the acoustic velocity of a bulk wave in the high acoustic velocity support substrate 51 is higher than the acoustic velocities of acoustic waves such as a surface wave, a boundary wave, and the like propagating through the piezoelectric film 53, and confines a surface acoustic wave in a portion where the piezoelectric film 53 and the low acoustic velocity film 52 are stacked on top of each other and prevents the surface acoustic wave from leaking downward below the high acoustic velocity support substrate 51. The high acoustic velocity support substrate 51 is, for example, a silicon substrate and has a thickness of, for example, about 200 μm.

The low acoustic velocity film 52 is a film such that the acoustic velocity of a bulk wave in the low acoustic velocity film 52 is lower than the acoustic velocity of a bulk wave propagating through the piezoelectric film 53 and is between the piezoelectric film 53 and the high acoustic velocity support substrate 51. According to this structure and because energy of acoustic wave is focused in a medium where the acoustic velocity is inherently low, the leakage of surface acoustic wave energy to outside the IDT electrode is reduced or prevented. The low acoustic velocity film 52 is, for example, a film whose main component is silicon dioxide and has a thickness of, for example, about 670 nm.

Note that according to the foregoing multilayer structure of the substrate 5, it becomes possible to increase the Q factor substantially at a resonant frequency and an antiresonant frequency compared with a prior art structure in which a single layer of a piezoelectric substrate is used. That is to say, because an acoustic wave resonator having a high Q factor can be provided, it becomes possible to provide a filter having a low insertion loss using such acoustic wave resonator.

Further, in the case where withdrawal electrodes are used for an acoustic wave resonator, which will be described below, in an attempt to improve the steepness at an end portion of a pass band of the acoustic wave filter 1, it is expected that in some cases an equivalent Q factor of the acoustic wave resonator becomes smaller. On the other hand, the multilayer structure of the foregoing substrate enables to maintain a high Q factor in the acoustic wave resonator 100. Accordingly, it becomes possible to provide the acoustic wave filter 1 in which low loss in the pass band is maintained.

Note that the high acoustic velocity support substrate 51 may alternatively have a structure in which a support substrate and a high acoustic velocity film are stacked on top of each other, the high acoustic velocity film being such that the acoustic velocity of a bulk wave propagating through the high acoustic velocity film is higher than the acoustic velocities of acoustic waves such as a surface wave, a boundary wave, and the like propagating through the piezoelectric film 53. In this case, for example, for the support substrate, a piezoelectric body such as sapphire, lithium tantalate, lithium niobite, crystal, or the like, various ceramics such as alumina, magnesia, silicon nitride, aluminum nitride, silicon carbide, zirconia, cordierite, mullite, steatite, forsterite, or the like, a dielectric body such as glass or the like, a semiconductor such as silicon, gallium nitride, or the like, or a resin substrate or the like may be used. Further, for the high acoustic velocity film, various high acoustic velocity materials such as, aluminum nitride, aluminum oxide, silicon carbide, silicon nitride, silicon oxynitride, a DLC film, diamond, a medium whose main component is one of these materials, a medium whose main component is a mixture of these materials, or the like may be used.

Figure 2B:
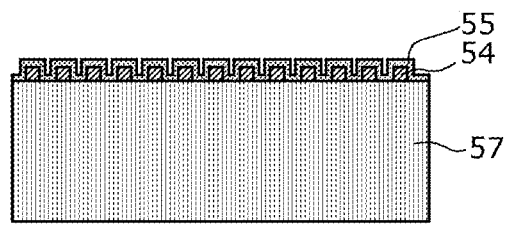
FIG. 2B is a cross-sectional view schematically illustrating an acoustic wave resonator according to a modified example 1 of a preferred embodiment of the present invention.

Further, FIG. 2B is a cross-sectional view schematically illustrating an acoustic wave resonator according to a modified example 1 of a preferred embodiment of the present invention. In the acoustic wave resonator 100 illustrated in FIG. 2A, an example is described using the case where the IDT electrode 54 is provided on the substrate 5 including the piezoelectric film 53. However, as illustrated in FIG. 2B, the substrate on which the IDT electrode 54 is provided may alternatively be a piezoelectric single crystal substrate 57 including a single layer of a piezoelectric layer. The piezoelectric single crystal substrate 57 is, for example, made of a piezoelectric single crystal of LiNbO$_3$. The acoustic wave resonator 100 according to the present modified example includes a piezoelectric single crystal substrate 57 of LiNbO$_3$, the IDT electrode 54, and the protective layer 55 provided on the piezoelectric single crystal substrate 57 and the IDT electrode 54.

The multilayer structures, the materials, the cut angles, and the thicknesses of the piezoelectric film 53 and the piezoelectric single crystal substrate 57 described above may be appropriately changed in accordance with required bandpass characteristics of the acoustic wave filter device and any other similar requirement. Advantageous effects the same as or similar to those of the acoustic wave resonator 100 that uses the piezoelectric film 53 described above can be produced even with an acoustic wave resonator 100 that uses a LiTaO$_3$ piezoelectric substrate with a cut angle different from the cut angle described above or any similar substrate.

Further, the substrate on which the IDT electrode 54 is provided may alternatively have a structure in which a support substrate, an energy confinement layer, and a piezoelectric film are stacked on top of each other. The IDT electrode 54 is provided on the piezoelectric film. For the piezoelectric film, for example, a LiTaO$_3$ piezoelectric single crystal or a piezoelectric ceramic may be used. The support substrate supports the piezoelectric film, the energy confinement layer, and the IDT electrode 54.

The energy confinement layer includes a single layer or a plurality of layers, and the velocity of an acoustic bulk wave propagating through at least one of layers of the energy confinement layer is higher than the velocity of an acoustic wave propagating in the vicinity of the piezoelectric film. For example, the energy confinement layer may have a multilayer structure including a low acoustic velocity layer and a high acoustic velocity layer. The low acoustic velocity layer is a film such that the acoustic velocity of a bulk wave propagating through the low acoustic velocity layer is lower than the acoustic velocity of an acoustic wave propagating through the piezoelectric film. The high acoustic velocity layer is a film such that the acoustic velocity of a bulk wave propagating through the high acoustic velocity layer is higher than the acoustic velocity of an acoustic wave propagating through the piezoelectric film. The high acoustic velocity layer may be used as the support substrate.

Further, the energy confinement layer may alternatively be an acoustic impedance layer having a configuration in which a low acoustic impedance layer with a relatively low acoustic impedance and a high acoustic impedance layer with a relatively high acoustic impedance are stacked on top of each other in an alternating fashion.

Here, an example (working example) of electrode parameters of the IDT electrode that of the acoustic wave resonator 100 will be described.

The wavelength of the acoustic wave resonator is defined by a wavelength $\lambda$, which is a repetition period of the plurality of electrode fingers 150a or the plurality of electrode fingers 150b that constitute the IDT electrode 54 illustrated in FIG. 2A(b). Further, the electrode pitch is about ½ of the wavelength $\lambda$ and is defined by (W+S), where W is the line width of the electrode fingers 150a and 150b that constitute the comb-shaped electrodes 100a and 100b, and S is the space width between the electrode finger 150a and the electrode finger 150b that are adjacent to each other. Further, as illustrated in part (a) of FIG. 2A, the intersecting width L of a pair of the comb-shaped electrodes 100a and 100b is the overlapping length of the electrode fingers 150a and 150b when viewed from the acoustic wave propagation direction (X axis direction). Further, the electrode duty of each acoustic wave resonator is a line width share of the plurality of electrode fingers 150a and the plurality of electrode fingers 150b and is defined as W/(W+S), which is a ratio of the line width of the plurality of electrode fingers 150a and the plurality of electrode fingers 150b to the sum of this line width and the space width. Further, h is the height of the comb-shaped electrodes 100a and 100b. Hereinafter, parameters relating to the shape of the IDT electrode of the acoustic wave resonator such as the wavelength $\lambda$, the intersecting width L, the electrode duty, the height h, and the like of the IDT electrode 54 are defined as the electrode parameters.

3. Operating Principle of Acoustic Wave Filter

Next, an operating principle of a ladder acoustic wave filter according to the present preferred embodiment is described.

Figure 3A:
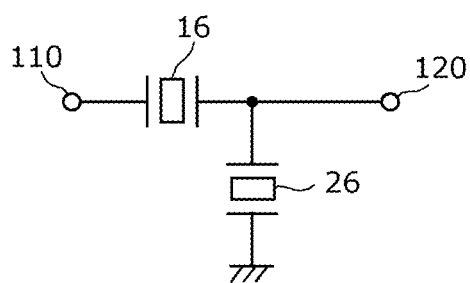
FIGS. 3A and 3B show circuit configuration diagrams for illustrating a basic operating principle of a ladder acoustic wave filter and a graph illustrating frequency characteristics thereof.
Figure 3B:
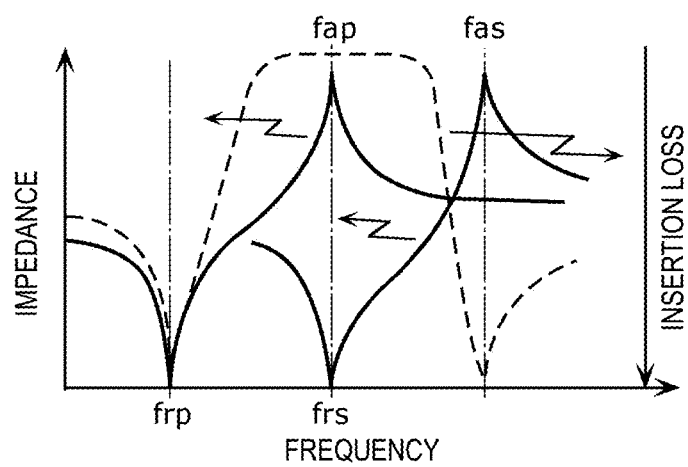

FIGS. 3A and 3B show circuit configuration diagrams for illustrating a basic operating principle of a ladder acoustic wave filter and a graph illustrating frequency characteristics thereof.

The acoustic wave filter illustrated in FIG. 3A is a basic ladder filter including one series arm resonator 16 and one parallel arm resonator 26. As illustrated in FIG. 3B, the parallel arm resonator 26 has a resonant frequency frp and an anti-resonant frequency fap (>frp) in terms of resonant characteristic. Further, the series arm resonator 16 has a resonant frequency frs and an anti-resonant frequency fas (>frs>frp) in terms of resonant characteristic.

When providing a band pass filter using ladder acoustic wave resonators, it is typical to set the anti-resonant frequency fap of the parallel arm resonator 26 and the resonant frequency frs of the series arm resonator 16 close to each other. Because of this, a low frequency side stop range is provided in the vicinity of the resonant frequency frp where the impedance of the parallel arm resonator 26 becomes close to 0. Further, as the frequency increases beyond this, the impedance of the parallel arm resonator 26 increases in the vicinity of the anti-resonant frequency fap, and the impedance of the series arm resonator 16 becomes close to 0 in the vicinity of the resonant frequency frs. Because of this, in the vicinity of the anti-resonant frequency fap to the resonant frequency frs, a signal pass range is provided in a signal path from the input/output terminal 110 to the input/output terminal 120. This enables a pass band reflecting the electrode parameters and electromechanical coupling coefficients of the acoustic wave resonators to be provided. Moreover, as the frequency increases and reaches the vicinity of the anti-resonant frequency fas, the impedance of the series arm resonator 16 increases, and a high frequency side stop range is provided.

In the acoustic wave filter with the foregoing operating principle, when a radio frequency signal is input from the input/output terminal 110, a potential difference is generated between the input/output terminal 110 and a reference terminal, and this causes a deformation of the piezoelectric layer and generates a surface acoustic wave. Here, by making the wavelength $\lambda$ of the IDT electrode 54 equal or substantially equal to the wavelength of the pass band, only the radio frequency signal having a frequency component desired to pass through passes this acoustic wave filter.

The number of resonant stages each including the parallel arm resonator and the series arm resonator is appropriately optimized according to the requirement specification. Generally, in the case where an acoustic wave filter includes a plurality of resonant stages, anti-resonant frequencies fap of a plurality of parallel arm resonators and resonant frequencies frs of a plurality of series arm resonators are provided in a pass band or in the vicinity thereof. Further, resonant frequencies frp of the plurality of parallel arm resonators are provided in a low frequency side stop range, and anti-resonant frequencies fas of the plurality of series arm resonators are provided in a high frequency side stop range.

According to the foregoing operating principle of the ladder acoustic wave filter, in the bandpass characteristics, the steepness at the low frequency side end portion of the pass band strongly depends on frequency differences between the resonant frequencies frp and the anti-resonant frequencies fap of the plurality of parallel arm resonators (resonant band widths). That is to say, the smaller the resonant band widths of the plurality of parallel arm resonators are, the larger the inclinations of straight lines connecting the resonant frequencies frp and the anti-resonant frequencies fap (with respect to the horizontal line) become, and thus the steepness becomes higher at the low frequency side end portion of the pass band in the bandpass characteristics. Further, in the bandpass characteristics, the steepness at the high frequency side end portion of the pass band strongly depends on frequency differences (resonant band widths) between the resonant frequencies frs and the anti-resonant frequencies fas of the plurality of series arm resonators. That is to say, the smaller the resonant band widths of the plurality of series arm resonators are, the larger the inclinations of straight lines connecting the resonant frequencies frs and the anti-resonant frequencies fas (with respect to the horizontal line) become, and thus the steepness becomes higher at the high frequency side end part of the pass band in the bandpass characteristics.

Further, the insertion loss in the pass band strongly depends on the Q factors at the anti-resonant frequencies fap of the plurality of parallel arm resonators and the Q factors at the resonant frequencies frs of the plurality of series arm resonators. That is to say, the higher the Q factors at the anti-resonant frequencies fap of the plurality of parallel arm resonators are, the smaller the insertion loss in the pass band becomes, and the higher the Q factors at the resonant frequencies frs of the plurality of series arm resonators are, the smaller the insertion loss in the pass band becomes.

According to the basic operating principle of an acoustic wave filter described above, the insertion loss and the steepness in the pass band of the acoustic wave filter 1 according to the present preferred embodiment are determined by adjusting the resonant frequency, the anti-resonant frequency, the resonant band width, and the Q factor of each of the series arm resonators s1 and s2 and the parallel arm resonators p1 and p2.

Figure 4:
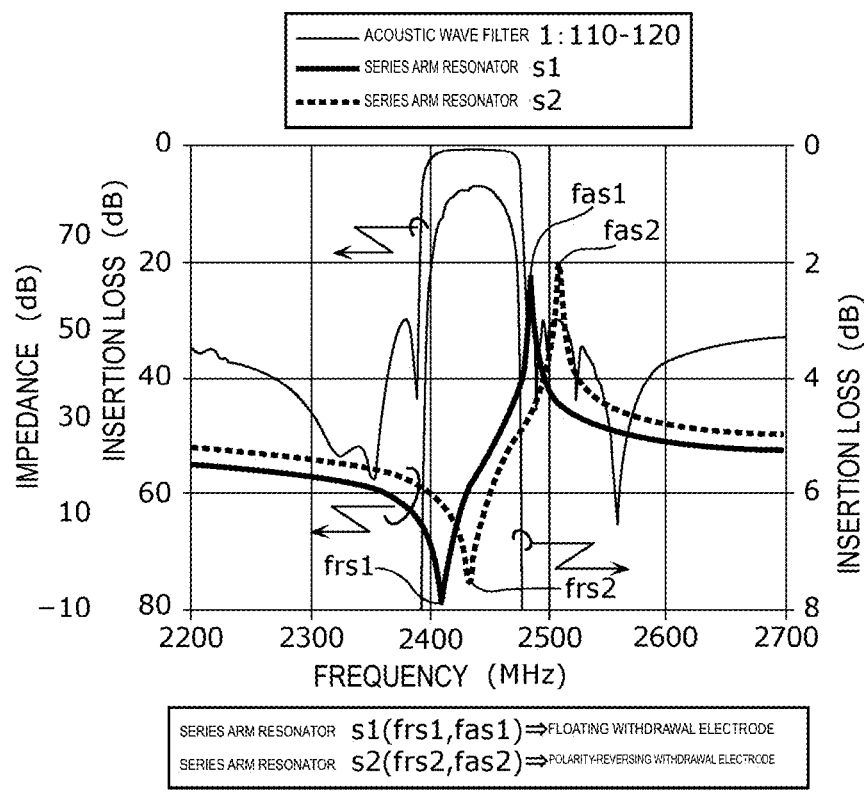
FIG. 4 is a graph illustrating a bandpass characteristic of an acoustic wave filter and impedance characteristics of series arm resonators according to a preferred embodiment of the present invention.

4. Resonant Characteristic and Bandpass Characteristic of Acoustic Wave Filter 1 According to a Preferred Embodiment FIG. 4 is a graph illustrating the bandpass characteristic of the acoustic wave filter 1 and the impedance characteristics of the series arm resonators s1 and s2 according to a preferred embodiment of the present invention. Note that FIG. 4 does not illustrate the impedance characteristics of the parallel arm resonators p1 and p2.

In the acoustic wave filter 1 according to the present preferred embodiment, a resonant frequency frp1 of the parallel arm resonator p1 and a resonant frequency frp2 of the parallel arm resonator p2, where the impedances are local minima, are in the low frequency side stop range. Further, an anti-resonant frequency fap1 of the parallel arm resonator p1 and an anti-resonant frequency fap2 of the parallel arm resonator p2, where the impedances are local maxima, and a resonant frequency frs1 of the series arm resonator s1 and a resonant frequency frs2 of the series arm resonator s2, where the impedances are local minima, are in the signal pass range of the pass band. Further, an anti-resonant frequency fas1 of the series arm resonator s1 and an anti-resonant frequency fas2 of the series arm resonator s2, where the impedances are local maxima, are in the high frequency side stop range.

Here, the anti-resonant frequency fas1 of the series arm resonator s1 is lower than the anti-resonant frequency fas2 of the series arm resonator s2. That is to say, of the plurality of series arm resonators of the acoustic wave filter 1, the series arm resonator s1 (first series arm resonator) has the lowest anti-resonant frequency fas. Moreover, the series arm resonator s1 includes the IDT electrode including floating withdrawal electrodes.

On the other hand, of the plurality of series arm resonators of the acoustic wave filter 1, the series arm resonator s2 includes the IDT electrode including polarity-reversing withdrawal electrodes.

Note that "the plurality of series arm resonators that constitute the acoustic wave filter 1" described above are the series arm resonators providing the pass band of the acoustic wave filter 1 and do not include any series arm resonator provided only to generate an attenuation pole in a band separated from the pass band. Specifically, the plurality of series arm resonators of the acoustic wave filter 1 are limited to the series arm resonators whose resonant frequencies frs are in the pass band of the acoustic wave filter 1 or in the vicinity thereof.

Further, electrode finger configurations of withdrawal electrodes exemplified as the floating withdrawal electrodes and the polarity-reversing withdrawal electrodes will be described below using FIGS. 5A to 5C, and resonant characteristics of the foregoing withdrawal electrodes will be described below using FIGS. 6A to 6C.

In the ladder acoustic wave filter including a plurality of series arm resonators and one or more parallel arm resonators, in order to improve the steepness at an end portion of the pass band, a withdrawal electrode is used for the IDT electrode of each resonator.

In the acoustic wave filter 1 according to the present preferred embodiment, resonant characteristics in the vicinities of the anti-resonant frequencies fas of the series arm resonators s1 and s2 greatly affect the steepness at the high frequency side end portion of the pass band. In the case where the withdrawal electrodes are used for the IDT electrodes of the series arm resonators s1 and s2 to improve the steepness at the end portion of the pass band, depending on the electrode finger structure of the withdrawal electrode, the mode of change in the resonant band width and the mode of change in the resonant Q factors at the resonance point and the anti-resonance point vary. With both the floating withdrawal electrode and the polarity-reversing withdrawal electrode, the resonant band width (fractional band) becomes narrower as the withdrawal ratio increases. Further, with the floating withdrawal electrodes, as the withdrawal ratio increases, the decrease in the Q factor at the resonance point becomes larger, whereas the decrease in the Q factor at the anti-resonance point becomes smaller. On the other hand, with the polarity-reversing withdrawal electrodes, as the withdrawal ratio increases, the decrease in the Q factor at the anti-resonance point becomes larger, whereas the decrease in the Q factor at the resonance point becomes smaller.

According to the foregoing configuration, the floating withdrawal electrode having a smaller Q factor decrease at the anti-resonance point is used for the IDT electrode of the series arm resonator s1 that has the lowest anti-resonant frequency fas among the series arm resonators s1 and s2, and the polarity-reversing withdrawal electrode having a smaller Q factor decrease at the resonance point is used for the series arm resonator s2. This enables an improvement of the steepness on the high frequency side of the pass band by mainly utilizing the resonant characteristic in the vicinity of the anti-resonance point of the series arm resonator s1 and reduces or prevents degradation of the insertion loss in the pass band by utilizing the resonant characteristic in the vicinity of the resonance point of the series arm resonator s2. Accordingly, it becomes possible to improve the steepness at the end portion of the pass band of the acoustic wave filter 1 while reducing the insertion loss in the pass band thereof.

As an acoustic wave filter according to a modified example 2 of the present preferred embodiment, by optimizing resonant characteristics of the parallel arm resonators p1 and p2 of the acoustic wave filter 1 illustrated in FIG. 1, it becomes possible to improve the steepness at the low frequency side end portion of the pass band of the acoustic wave filter according to the modified example 2 while reducing the insertion loss in the pass band thereof.

Specifically, in the acoustic wave filter according to the modified example 2, the resonant frequency frp1 of the parallel arm resonator p1 is higher than the resonant frequency frp2 of the parallel arm resonator p2. That is to say, of the plurality of parallel arm resonators of the acoustic wave filter 1, the parallel arm resonator p1 (first parallel arm resonator) has the highest resonant frequency frp. Moreover, the parallel arm resonator p1 includes the IDT electrode including the polarity-reversing withdrawal electrodes, and of the plurality of parallel arm resonators that constitute the acoustic wave filter, the parallel arm resonator p2 includes the IDT electrode including the floating withdrawal electrodes.

Note that "the plurality of parallel arm resonators that constitute the acoustic wave filter" described above are the parallel arm resonators defining the pass band of the acoustic wave filter and do not include any parallel arm resonator provided only to define an attenuation pole in a band separated from the pass band. Specifically, the plurality of parallel arm resonators of the acoustic wave filter are limited to the parallel arm resonators whose anti-resonant frequencies fap are in the pass band of the acoustic wave filter or in the vicinity thereof.

Further, in this case, the series arm resonators s1 and s2 do not need to include the withdrawal electrode, and further, there is no limitation on the relative height of frequency among the resonant frequencies and the relative height of frequency among the anti-resonant frequencies of the series arm resonators s1 and s2.

In a ladder acoustic wave filter made up of one or more series arm resonators and a plurality of parallel arm resonators, in order to improve the steepness at an end portion of a pass band, a withdrawal electrode is used for the IDT electrode of each resonator.

In the acoustic wave filter according to the present modified example, resonant characteristics in the vicinities of the resonant frequencies frp of the parallel arm resonators p1 and p2 greatly affect the steepness at the low frequency side end portion of the pass band.

According to the foregoing configuration, the polarity-reversing withdrawal electrode having a smaller Q factor decrease at the resonance point is used for the IDT electrode of the parallel arm resonator p1 that has the highest resonant frequency frp among the parallel arm resonators p1 and p2, and the floating withdrawal electrode having a smaller Q factor decrease at the anti-resonance point is used for the parallel arm resonator p2. This improves the steepness on the low frequency side of the pass band by mainly utilizing the resonant characteristic in the vicinity of the resonance point of the parallel arm resonator p1 and reduces or prevents degradation of the insertion loss in the pass band by utilizing the resonant characteristic in the vicinity of the anti-resonance point of the parallel arm resonator p2. Accordingly, it becomes possible to improve the steepness at the end portion of the pass band of the acoustic wave filter according to the modified example 2 while reducing the insertion loss in the pass band thereof.

In the acoustic wave filter 1 according to the present preferred embodiment, the series arm resonator s1 includes the floating withdrawal electrodes, and the series arm resonator s2 includes the polarity-reversing withdrawal electrodes. Further, in the acoustic wave filter according to the modified example 2, the parallel arm resonator p1 includes the polarity-reversing withdrawal electrodes, and the parallel arm resonator p2 includes the floating withdrawal electrodes.

In the following section, examples of structures of the withdrawal electrodes included in the series arm resonators s1 and s2 and the parallel arm resonators p1 and p2 are described.

5. Electrode Finger Structure of Withdrawal Electrode

Hereinbelow, examples of the electrode finger structure of the IDT electrode including withdrawal electrodes are described using FIGS. 5A to 5C.

Figure 5A:
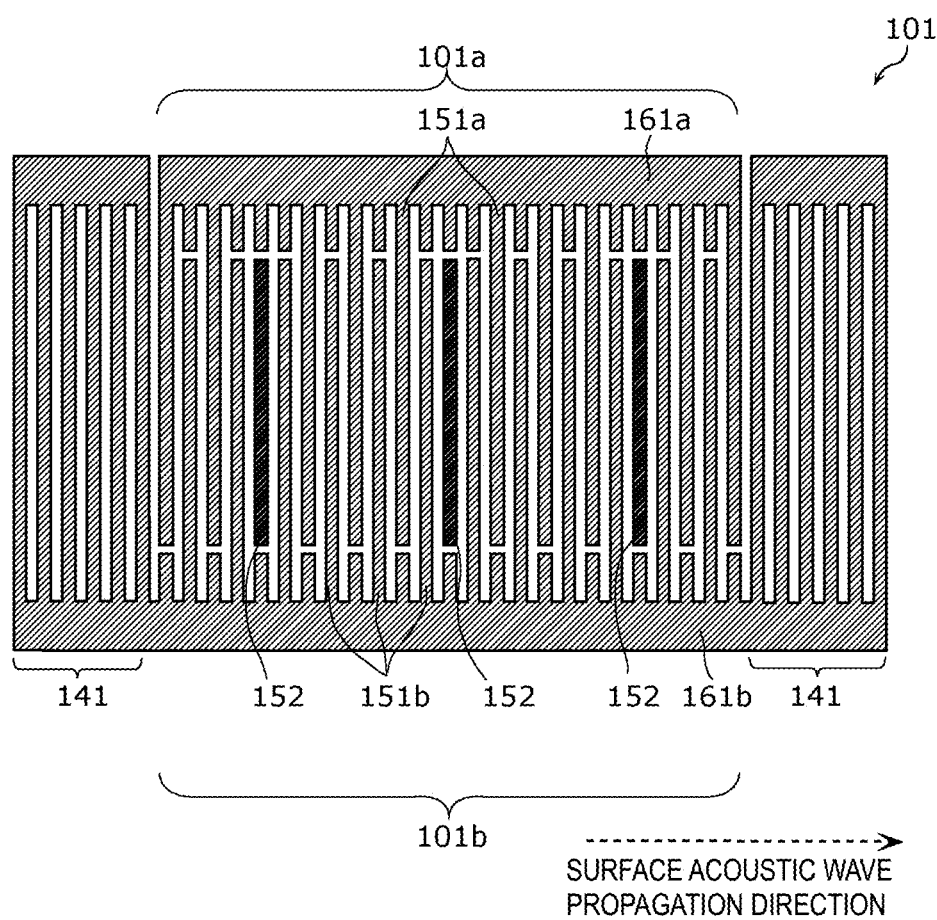
FIG. 5A is an outline plan view illustrating a configuration of an IDT electrode including floating withdrawal electrodes in an acoustic wave filter according to a preferred embodiment of the present invention.

FIG. 5A is an outline plan view illustrating a configuration of the IDT electrode including the floating withdrawal electrodes. FIG. 5B is an outline plan view illustrating a configuration of the IDT electrode including the polarity-reversing withdrawal electrodes. FIG. 5C is an outline plan view illustrating a configuration of the IDT electrode including a filling withdrawal electrodes.

FIG. 5A illustrates an example of a schematic plan view illustrating an IDT electrode structure of an acoustic wave resonator 101 including the floating withdrawal electrodes. The acoustic wave resonator 101 illustrated in FIG. 5A is for illustrating a typical structure of the floating withdrawal electrode, and the number, the lengths, and the like of electrode fingers of the electrode are not limited thereto.

The acoustic wave resonator 101 includes a substrate 5 having piezoelectricity, comb-shaped electrodes 101a and 101b on the substrate 5, and reflectors 141.

As illustrated in FIG. 5A, the comb-shaped electrode 101a includes a plurality of electrode fingers 151a that are parallel or substantially parallel to each other and a busbar electrode 161a that connects one-end portions of the plurality of electrode fingers 151a. Further, the comb-shaped electrode 101b includes a plurality of electrode fingers 151b that are parallel or substantially parallel to each other and a busbar electrode 161b that connects one-end portions of the plurality of electrode fingers 151b. The plurality of electrode fingers 151a and the plurality of electrode fingers 151b extend in a direction orthogonal or substantially orthogonal to a surface acoustic wave propagation direction (X axis direction). The comb-shaped electrodes 101a and 101b are arranged opposite each other such that the plurality of electrode fingers 151a and the plurality of electrode fingers 151b interdigitate with each other. That is to say, the IDT electrode of the acoustic wave resonator 101 includes a pair of the comb-shaped electrodes 101a and 101b.

Note that the comb-shaped electrode 101a includes dummy electrodes facing the plurality of electrode fingers 151b in the length direction thereof. However, the comb-shaped electrode 101a does not need to include these dummy electrodes. Further, the comb-shaped electrode 101b includes dummy electrodes facing the plurality of electrode fingers 151a in the length direction thereof. However, the comb-shaped electrode 101b does not need to include these dummy electrodes. Further, the comb-shaped electrodes 101a and 101b may be a slanted IDT electrode in which the extending direction of the busbar electrode is slanted with respect to the surface acoustic wave propagation direction or may have a piston structure.

The reflectors 141 each include a plurality of electrode fingers that are parallel or substantially parallel to each other and a busbar electrode that connects the plurality of electrode fingers and are provided on both sides of the pair of the comb-shaped electrodes 101a and 101b.

Note that as illustrated in part (b) of FIG. 2A, the IDT electrode including the pair of the comb-shaped electrodes 101a and 101b has a multilayer structure including the close contact layer 540 and the primary electrode layer 542. However, the multilayer structure is not limited thereto.

Here, in the IDT electrode of the acoustic wave resonator 101, electrode fingers 152 are provided separately. The electrode finger 152 is the floating withdrawal electrodes that is connected to neither of the busbar electrodes 161a and 161b and is in parallel or substantially in parallel to and with the same pitch as the plurality of electrode fingers 151a and the plurality of electrode fingers 151b. Further, a plurality of the electrode fingers 151a and 151b are provided between two adjacent electrode fingers 152. That is to say, the pitch of the electrode fingers 152 is larger than the pitch of the plurality of the electrode fingers 151a and 151b.

Here, the withdrawal ratio of the IDT electrode including the floating withdrawal electrodes is defined. The withdrawal ratio of the IDT electrode in the acoustic wave resonator 101 is expressed by the following Equation 1, where M is the number of the electrode fingers 152 in this IDT electrode, and N is the number of pairs in the IDT electrode in the case where a set of adjacent electrode fingers 151a and 151b is defined as a pair of electrode fingers and the IDT electrode is provided only by repeating this set of electrode fingers 151a and 151b without using the electrode fingers 152.

$$\text{Withdrawal ratio} = M/(2(N-M)+1) \quad \text{(Equation 1)}$$

Figure 5B:
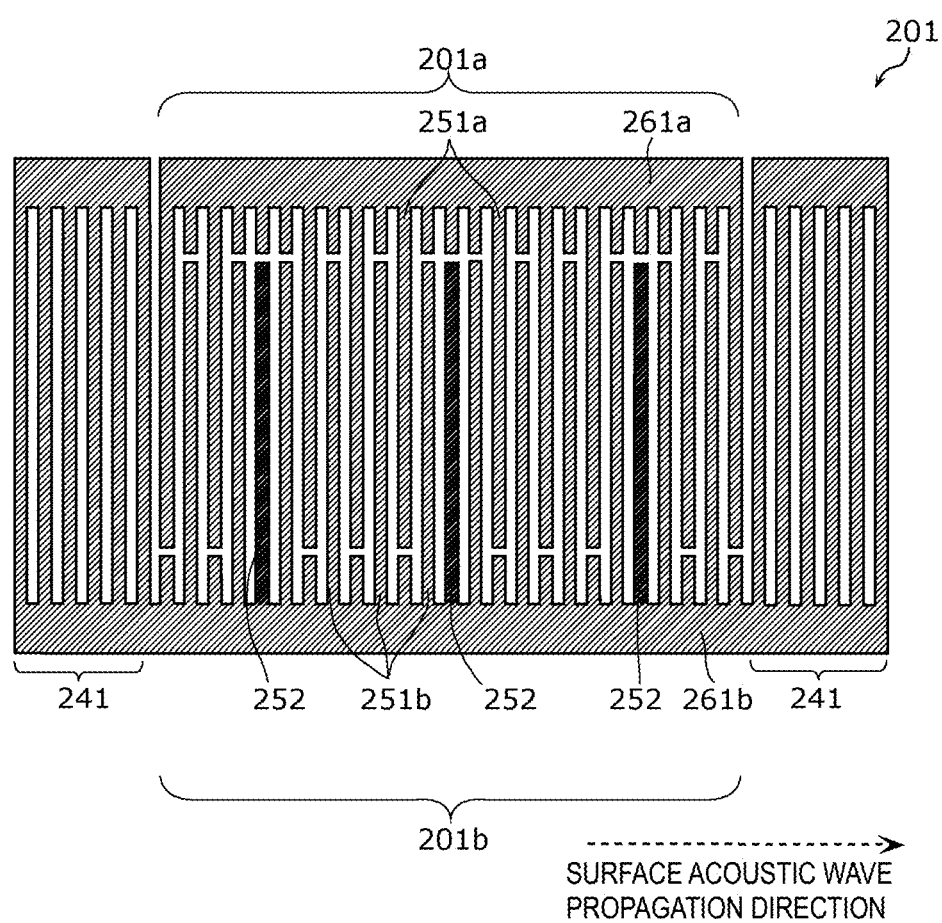
FIG. 5B is an outline plan view illustrating a configuration of an IDT electrode including polarity-reversing withdrawal electrodes in an acoustic wave filter according to a preferred embodiment of the present invention.

FIG. 5B illustrates an example of a schematic plan view illustrating an IDT electrode structure of an acoustic wave resonator 201 including the polarity-reversing withdrawal electrodes. Note that the acoustic wave resonator 201 illustrated in FIG. 5B is for illustrating a typical structure of the polarity-reversing withdrawal electrode, and the number, the lengths, and the like of electrode fingers of the electrode are not limited thereto.

The acoustic wave resonator 201 includes the substrate 5 having piezoelectricity, comb-shaped electrodes 201a and 201b provided on the substrate 5, and reflectors 241.

As illustrated in FIG. 5B, the comb-shaped electrode 201a includes a plurality of electrode fingers 251a that are parallel or substantially parallel to each other and a busbar electrode 261a that connects one-end portions of the plurality of electrode fingers 251a. Further, the comb-shaped electrode 201b includes a plurality of electrode fingers 251b that are parallel or substantially parallel to each other and a busbar electrode 261b that connects one-end portions of the plurality of electrode fingers 251b. The plurality of electrode fingers 251a and the plurality of electrode fingers 251b extend in a direction orthogonal or substantially orthogonal to the surface acoustic wave propagation direction (X axis direction). The comb-shaped electrodes 201a and 201b are arranged opposite to each other such that the plurality of electrode fingers 251a and the plurality of electrode fingers 251b are interdigitated with each other. That is to say, the IDT electrode of the acoustic wave resonator 201 includes a pair of the comb-shaped electrodes 201a and 201b.

The comb-shaped electrode 201a includes dummy electrodes facing the plurality of electrode fingers 251b in the length direction thereof. However, the comb-shaped electrode 201a does not need to include these dummy electrodes. Further, the comb-shaped electrode 201b includes dummy electrodes facing the plurality of electrode fingers 251a in the length direction thereof. However, the comb-shaped electrode 201b does not need to include these dummy electrodes. Further, the comb-shaped electrodes 201a and 201b may be a slanted IDT electrode in which the extending direction of the busbar electrode is slanted with respect to the surface acoustic wave propagation direction or may have a piston structure.

The reflectors 241 include a plurality of electrode fingers that are parallel or substantially parallel to each other and a busbar electrode that connects the plurality of electrode fingers and are provided on both sides of the pair of the comb-shaped electrodes 201a and 201b.

Note that as illustrated in part (b) of FIG. 2A, the IDT electrode including the pair of the comb-shaped electrodes 201a and 201b has a multilayer structure including the close contact layer 540 and the primary electrode layer 542. However, the multilayer structure is not limited thereto.

Here, in the IDT electrode of the acoustic wave resonator 201, the electrode fingers 252 are separately provided. The electrode finger 252 is the polarity-reversing withdrawal electrode that is, of all of the electrode fingers of the pair of the comb-shaped electrodes 201a and 201b, connected to the same busbar electrode to which the electrode fingers on both sides thereof are connected. Further, a plurality of the electrode fingers 251a and 251b are provided between two adjacent electrode fingers 252. That is to say, the pitch of the electrode fingers 252 is larger than the pitch of the plurality of the electrode fingers 251a and 251b.

Here, the withdrawal ratio of the IDT electrode including the polarity-reversing withdrawal electrodes is defined. The withdrawal ratio of the IDT electrode in the acoustic wave resonator 201 is expressed by the above-described Equation 1, where M is the number of the electrode fingers 252 in the IDT electrode, and N is the number of pairs in the IDT electrode in the case where a set of adjacent electrode fingers 251a and 251b is defined as a pair of electrode fingers and the IDT electrode is provided only by repeating this set of electrode fingers 251a and 251b without using the electrode fingers 252.

Figure 5C:
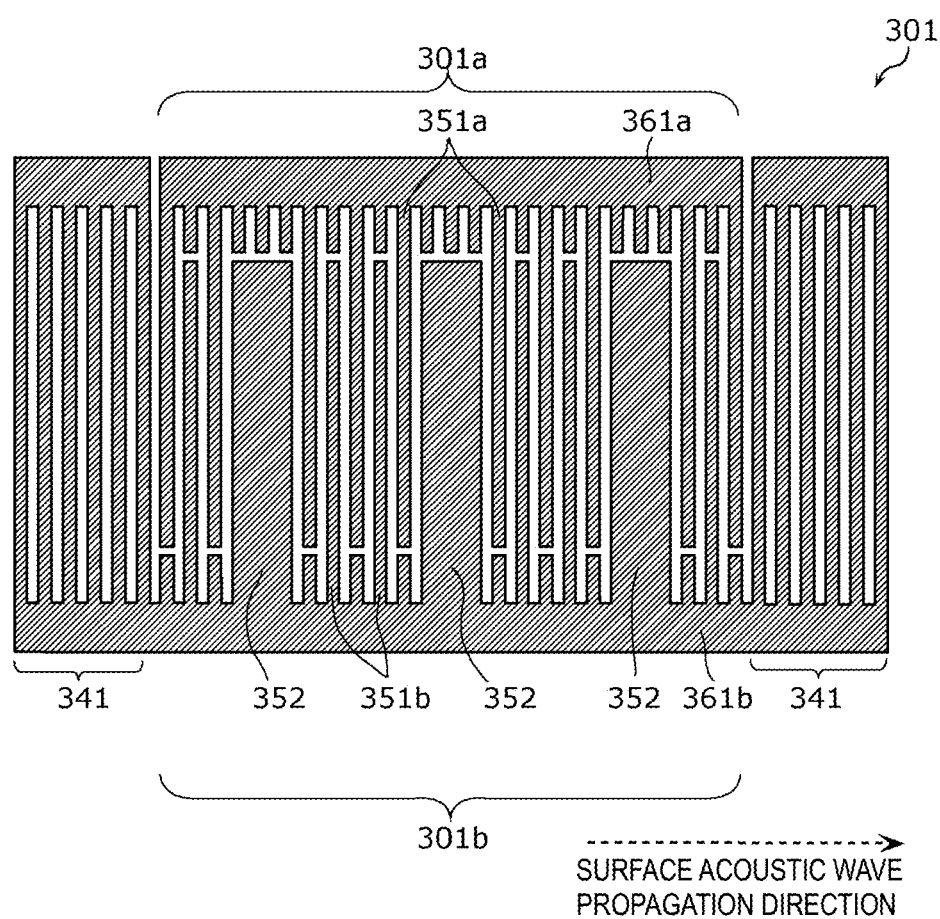
FIG. 5C is an outline plan view illustrating a configuration of an IDT electrode including filling withdrawal electrodes in an acoustic wave filter according to a preferred embodiment of the present invention.

FIG. 5C illustrates an example of a schematic plan view of an IDT electrode structure of an acoustic wave resonator 301 including the filling withdrawal electrodes. Note that the acoustic wave resonator 301 illustrated in FIG. 5C is for illustrating a typical structure of the filling withdrawal electrode, and the number, the lengths, and the like of electrode fingers that define the electrode are not limited thereto.

The acoustic wave resonator 301 includes a substrate 5 having piezoelectricity, comb-shaped electrodes 301a and 301b provided on the substrate 5, and reflectors 341.

As illustrated in FIG. 5C, the comb-shaped electrode 301a includes a plurality of electrode fingers 351a that are parallel or substantially parallel to each other and a busbar electrode 361a that connects one-end portions of the plurality of electrode fingers 351a. Further, the comb-shaped electrode 301b includes a plurality of electrode fingers 351b that are parallel or substantially parallel to each other and a busbar electrode 361b that connects one-end portions of the plurality of electrode fingers 351b. The plurality of electrode fingers 351a and the plurality of electrode fingers 351b extend in a direction orthogonal or substantially orthogonal to the surface acoustic wave propagation direction (X axis direction). The comb-shaped electrodes 301a and 301b are opposite each other such that the plurality of electrode fingers 351a and the plurality of electrode fingers 351b are interdigitated with each other. That is to say, the IDT electrode of the acoustic wave resonator 301 includes a pair of the comb-shaped electrodes 301a and 301b.

Note that the comb-shaped electrode 301a includes dummy electrodes facing the plurality of electrode fingers 351b in the length direction thereof. However, the comb-shaped electrode 301a does not need to include these dummy electrodes. Further, the comb-shaped electrode 301b includes dummy electrodes facing the plurality of electrode fingers 351a in the length direction thereof. However, the comb-shaped electrode 301b does not need to include these dummy electrodes. Further, the comb-shaped electrodes 301a and 301b may be a slanted IDT electrode in which the extending direction of the busbar electrode is slanted with respect to the surface acoustic wave propagation direction or may have a piston structure.

The reflectors 341 include a plurality of electrode fingers that are parallel or substantially parallel to each other and a busbar electrode that connects the plurality of electrode fingers and are provided on both sides of the pair of the comb-shaped electrodes 301a and 301b.

Note that as illustrated in part (b) of FIG. 2A, the IDT electrode including the pair of the comb-shaped electrodes 301a and 301b has a multilayer structure including the close contact layer 540 and the primary electrode layer 542. However, the multilayer structure is not limited thereto.

Here, in the IDT electrode of the acoustic wave resonator 301, the electrode fingers 352 are separately provided. The electrode finger 352 is the filling withdrawal electrode that is the electrode finger having the maximum electrode finger width in the IDT electrode of the acoustic wave resonator 301 and has an electrode finger width equal to or wider than about twice the average electrode finger width of the electrode fingers other than the electrode fingers 352. In other words, the electrode finger 352 is the filling withdrawal electrode that has the electrode finger width wider than those of the plurality of electrode fingers 351a and 351b and is defined by combining adjacent electrode fingers 351a and 351b and a space between these adjacent electrode fingers 351a and 351b to provide a single electrode finger and connecting this single electrode finger to one of the busbar electrodes 361a and 361b. Further, a plurality of the electrode fingers 351a and 351b are arranged between two adjacent electrode fingers 352. That is to say, the pitch of the electrode fingers 352 is larger than the pitch of the plurality of the electrode fingers 351a and 351b.

Here, the withdrawal ratio of the IDT electrode including the filling withdrawal electrodes is defined. The withdrawal ratio of the IDT electrode in the acoustic wave resonator 301 is expressed by the above-described Equation 1, where M is the number of the electrode fingers 352 in this IDT electrode, and N is the number of pairs in the IDT electrode in the case where a set of adjacent electrode fingers 351a and 351b is defined as a pair of electrode fingers and the IDT electrode is formed only by repeating this set of electrode fingers 351a and 351b without using the electrode fingers 352.

6. Resonant Characteristic of Acoustic Wave Resonator Including Withdrawal Electrode FIG. 6A shows graphs illustrating the impedance (part (a) of FIG. 6A) and the Q factor (part (b) of FIG. 6A) of an acoustic wave resonator including the floating withdrawal electrodes when the withdrawal ratio is changed (withdrawal ratio: about 0%, about 4%, about 7%, and about 14%). FIG. 6B shows graphs illustrating the impedance (part (a) of FIG. 6B) and the Q factor (part (b) of FIG. 6B) of an acoustic wave resonator including the polarity-reversing withdrawal electrodes when the withdrawal ratio is changed (withdrawal ratio: about 0%, about 4%, about 7%, and about 14%). FIG. 6C shows graphs illustrating the impedance (part (a) of FIG. 6C) and the Q factor (part (b) of FIG. 6C) of an acoustic wave resonator including the filling withdrawal electrodes when the withdrawal ratio is changed (withdrawal ratio: about 0%, about 4%, about 7%, and about 14%).

Figure 6A:
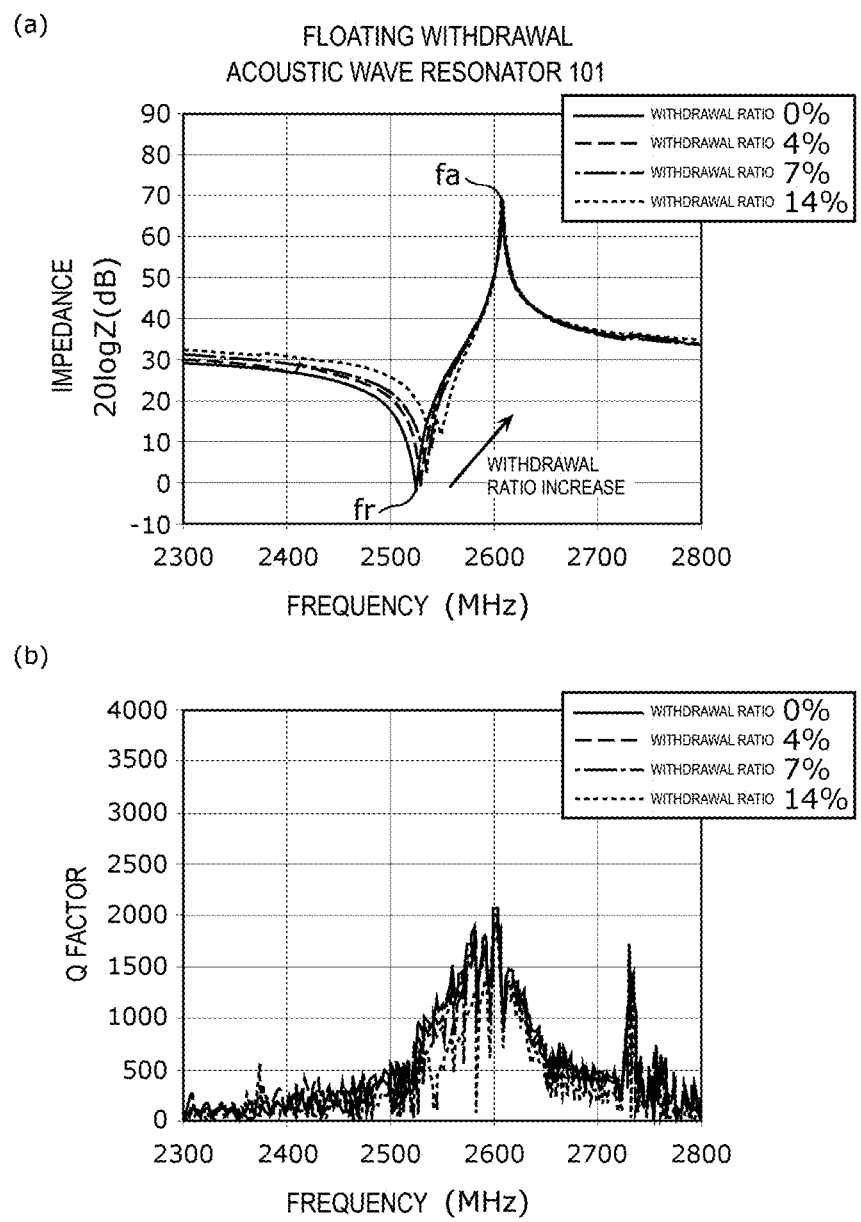
FIG. 6A shows graphs illustrating the impedance and the Q factor of an acoustic wave resonator including floating withdrawal electrodes when a withdrawal ratio is changed.

As illustrated in part (a) of FIG. 6A, the impedance that indicates the resonant characteristic of the acoustic wave resonator 101 reaches a local minimum value that comes close to 0 at the resonant frequency fr and reaches a local maximum value that comes close to infinity at the anti-resonant frequency fa. Here, as the withdrawal ratio of the floating withdrawal electrode increases, the resonant frequency fr shifts to the high frequency side. On the other hand, the change in the withdrawal ratio of the floating withdrawal electrode does not cause a substantial change in the anti-resonant frequency fa. Because of this, as the withdrawal ratio of the floating withdrawal electrode increases, the resonant band width, which is the frequency difference between the resonant frequency fr and the anti-resonant frequency fa, becomes narrower.

On the other hand, as illustrated in part (b) of FIG. 6A, the Q factor of the acoustic wave resonator 101 decreases as the withdrawal ratio of the floating withdrawal electrode increases. However, the decrease in the Q factor near the anti-resonant frequency fa is relatively small, and the decrease in the Q factor near the resonant frequency fr is relatively large.

Figure 6B:
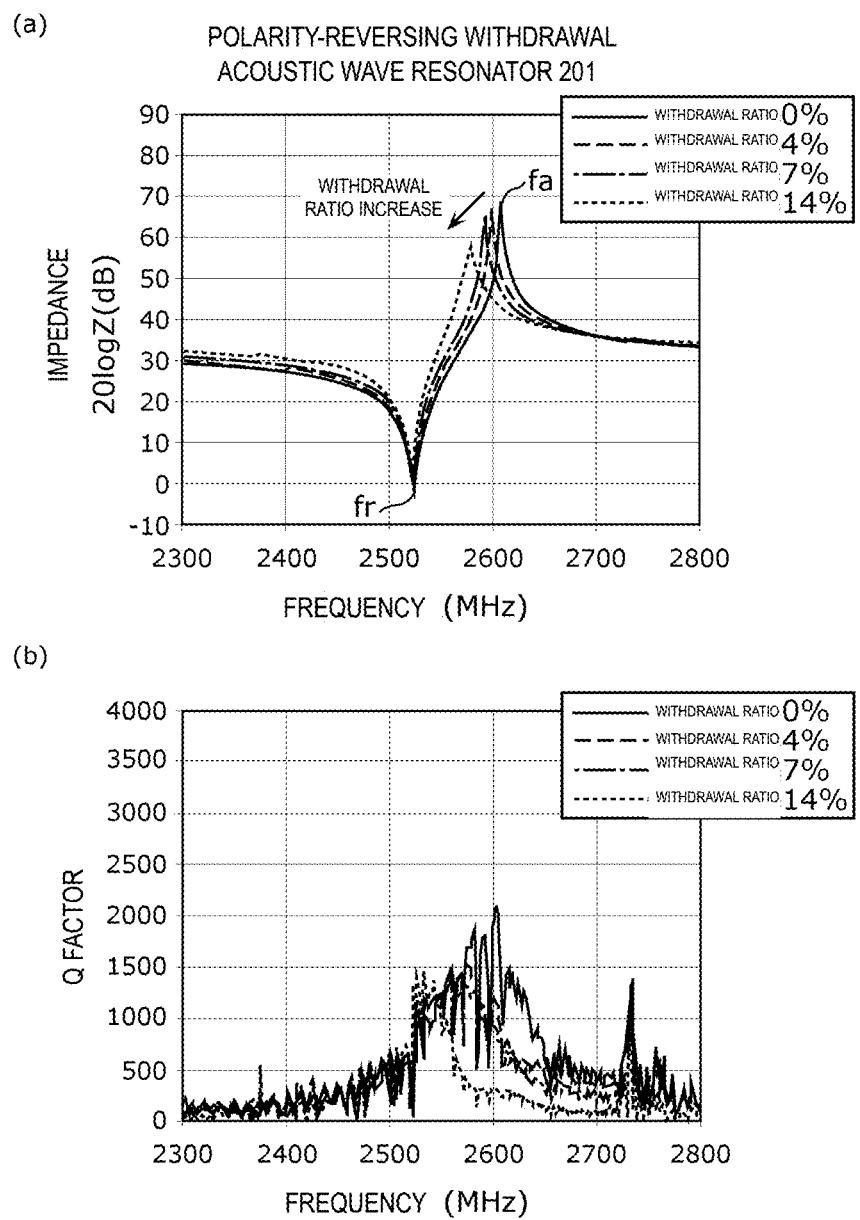
FIG. 6B shows graphs illustrating the impedance and the Q factor of an acoustic wave resonator including polarity-reversing withdrawal electrodes when the withdrawal ratio is changed.

Further, as illustrated in part (a) of FIG. 6B, the impedance that indicates the resonant characteristic of the acoustic wave resonator 201 reaches a local minimum value that comes close to 0 at the resonant frequency fr and reaches a local maximum value that comes close to infinity at the anti-resonant frequency fa. Here, the change in the withdrawal ratio of the polarity-reversing withdrawal electrode does not cause a substantial change in the resonant frequency fr. On the other hand, as the withdrawal ratio of the polarity-reversing withdrawal electrode increases, the anti-resonant frequency fa shifts to the low frequency side. Because of this, as the withdrawal ratio of the polarity-reversing withdrawal electrode increases, the resonant band width, which is the frequency difference between the resonant frequency fr and the anti-resonant frequency fa, becomes narrower.

On the other hand, as illustrated in part (b) of FIG. 6B, the Q factor of the acoustic wave resonator 201 decreases as the withdrawal ratio of the polarity-reversing withdrawal electrode increases. However, the decrease in the Q factor near the resonant frequency fr is relatively small, and the decrease in the Q factor near the anti-resonant frequency fa is relatively large.

Figure 6C:
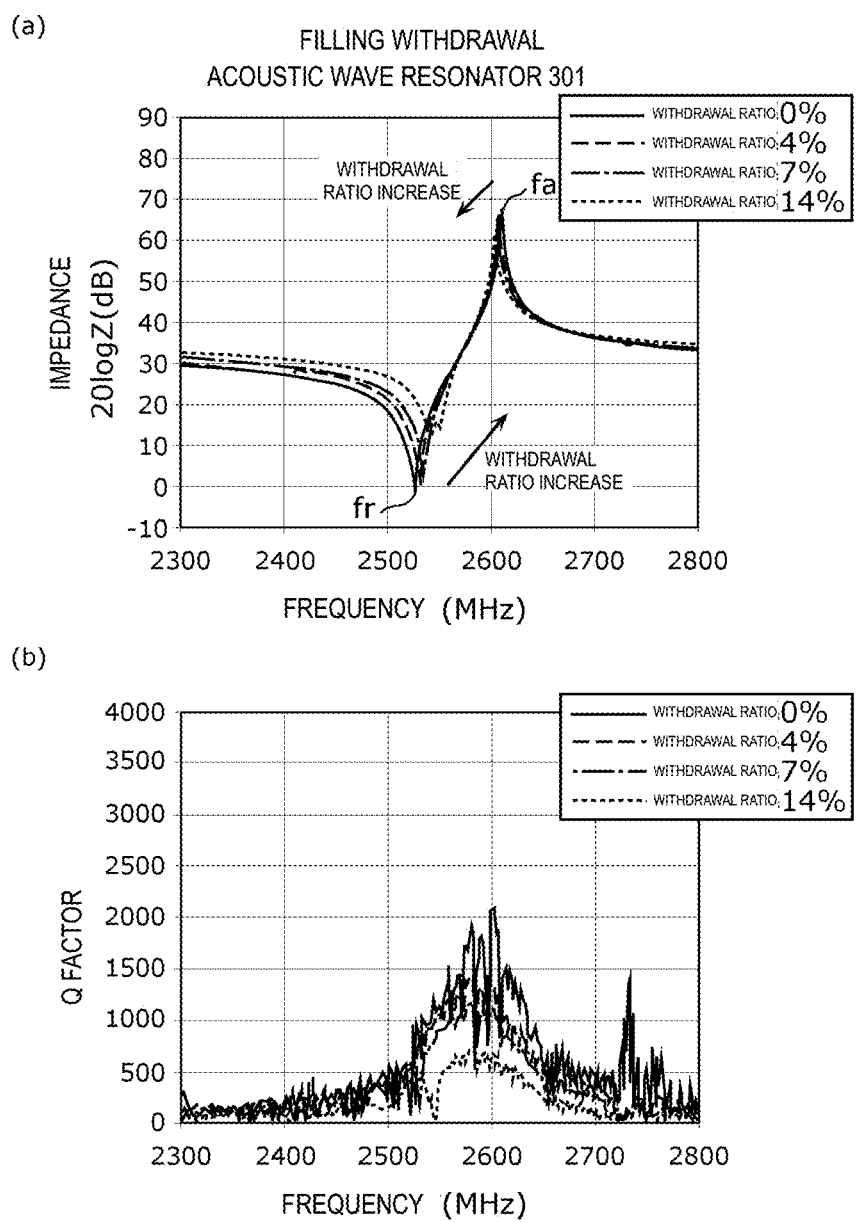
FIG. 6C shows graphs illustrating the impedance and the Q factor of an acoustic wave resonator including filling withdrawal electrodes when the withdrawal ratio is changed.

Further, as illustrated in part (a) of FIG. 6C, the impedance that indicates the resonant characteristic of the acoustic wave resonator 301 reaches a local minimum value that comes close to 0 at the resonant frequency fr and reaches a local maximum value that comes close to infinity at the anti-resonant frequency fa. Here, as the withdrawal ratio of the filling withdrawal electrode increases, the resonant frequency fr shifts to the high frequency side. On the other hand, as the withdrawal ratio of the filling withdrawal electrode increases, the anti-resonant frequency fa shifts to the low frequency side. Because of this, as the withdrawal ratio of the filling withdrawal electrode increases, the resonant band width, which is the frequency difference between the resonant frequency fr and the anti-resonant frequency fa, becomes narrower.

On the other hand, as illustrated in part (b) of FIG. 6C, the Q factor of the acoustic wave resonator 301 decreases as the withdrawal ratio of the filling withdrawal electrode increases. However, the decrease in the Q factor near the resonant frequency fr is relatively large, and the decrease in the Q factor near the anti-resonant frequency fa is also relatively large.

As described above, a different electrode finger structure of the withdrawal electrode results in a different mode of change in resonant band width and Q factors at the resonant frequency fr and the anti-resonant frequency fa.

Figure 7A:
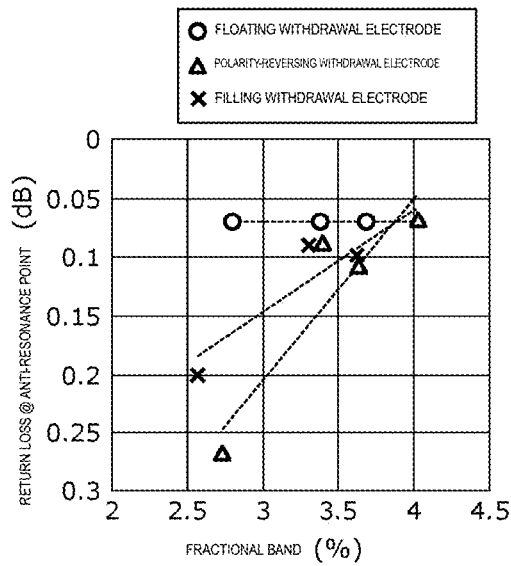
FIGS. 7A and 7B show graphs illustrating return losses at a resonance point and an anti-resonance point when the withdrawal ratio of the acoustic wave resonator is changed.
Figure 7B:
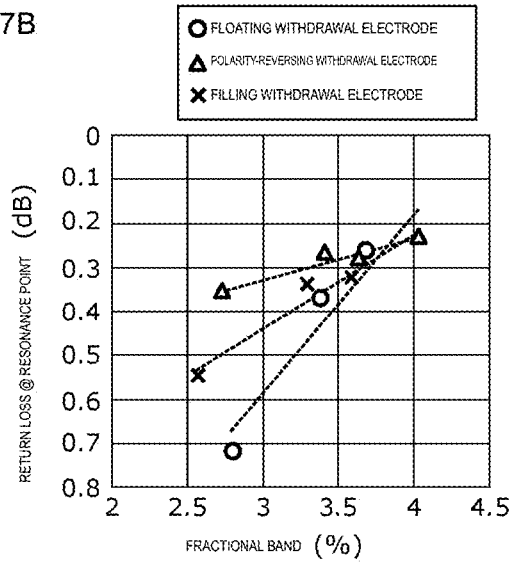

FIGS. 7A and 7B show graphs illustrating return losses at the anti-resonance point (FIG. 7A) and the resonance point (FIG. 7B) when the fractional band of the acoustic wave resonator is changed. The vertical axis in FIG. 7A represents the return loss of the acoustic wave resonator at the anti-resonance point, and the vertical axis in FIG. 7B represents the return loss of the acoustic wave resonator at the resonance point. Further, although the horizontal axes in FIGS. 7A and 7B each represent the fractional band (obtained by dividing the resonant band width by the resonant frequency), it is possible to convert the fractional band to the withdrawal ratio. In this case, the larger the fractional band is, the smaller the withdrawal ratio becomes.

From FIG. 7A, as the fractional band decreases (as the withdrawal ratio increases), the return losses of the acoustic wave resonator including the polarity-reversing withdrawal electrodes and the acoustic wave resonator including the filling withdrawal electrodes become larger. On the other hand, the return loss of the acoustic wave resonator including the floating withdrawal electrodes does not change even when the fractional band decreases (the withdrawal ratio increases).

Further, from FIG. 7B, as the fractional band decreases (as the withdrawal ratio increases), the return losses of the acoustic wave resonator including the floating withdrawal electrodes, the acoustic wave resonator including the polarity-reversing withdrawal electrodes, and the acoustic wave resonator including the filling withdrawal electrodes become larger. However, the return loss of the acoustic wave resonator including the polarity-reversing withdrawal electrodes is smaller than the return losses of the acoustic wave resonator including the floating withdrawal electrodes and the acoustic wave resonator including the filling withdrawal electrodes.

From FIGS. 7A and 7B, in the acoustic wave filter 1 according to the present preferred embodiment, by using the floating withdrawal electrode for the series arm resonator s1, it becomes possible to improve the steepness at the high frequency side end portion of the pass band by making the resonant band width narrower and reduce the insertion loss at the high frequency side end portion of the pass band by making the return loss near the anti-resonance point smaller. Further, by using the polarity-reversing withdrawal electrode for the series arm resonator s2, it becomes possible to reduce the insertion loss near the center of the pass band by making the return loss near the resonance point smaller.

Further, from FIGS. 7A and 7B, in the acoustic wave filter according to the modified example 2, by using the polarity-reversing withdrawal electrode for the parallel arm resonator p1, it becomes possible to improve the steepness at the low frequency side end portion of the pass band by making the resonant band width narrower and reduce the insertion loss at the low frequency side end portion of the pass band by making the return loss near the resonance point smaller. Further, by using the floating withdrawal electrode for the parallel arm resonator p2, it becomes possible to reduce the insertion loss near the center of the pass band by making the return loss near the anti-resonance point smaller.

Figure 8:
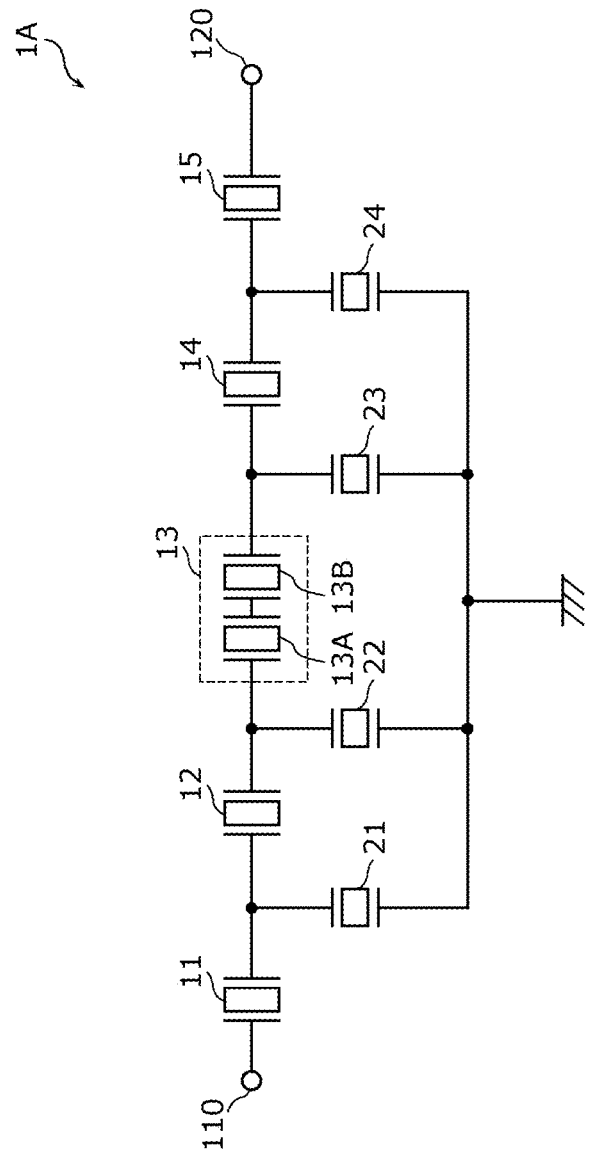
FIG. 8 is a circuit configuration diagram of an acoustic wave filter according to a working example of a preferred embodiment of the present invention.

7. Circuit Configuration, Bandpass Characteristic, and Resonant Characteristic of Acoustic Wave Filter 1A According to Working Example FIG. 8 is a circuit configuration diagram of an acoustic wave filter 1A according to a working example. The acoustic wave filter 1A according to the working example is one working example of the acoustic wave filter 1 according to the present preferred embodiment and is different from the acoustic wave filter 1 in the numbers of series arm resonators and parallel arm resonators.

As illustrated in FIG. 8, the acoustic wave filter 1A includes series arm resonators 11, 12, 13A, 13B, 14, and 15, parallel arm resonators 21, 22, 23, and 24, and input/output terminals 110 and 120.

The series arm resonators 11, 12, 13A, 13B, 14, and 15 are each an acoustic wave resonator provided along a path connecting the input/output terminal 110 and the input/output terminal 120 and are connected in series to each other. Further, each of the parallel arm resonators 21 to 24 is an acoustic wave resonator provided between a node in the path and ground.

According to the foregoing configuration, the acoustic wave filter 1A defines a ladder band pass filter.

Note that the series arm resonators 13A and 13B define a series arm resonant circuit 13. Each of the series arm resonators 13A and 13B is a divided resonator.

The divided resonators are provided in order to improve electric power handling capability and reduce or prevent intermodulation distortion of the acoustic wave filter 1A. By using two series-connected divided resonators to define a single acoustic wave resonator with a capacitive impedance, it becomes possible to secure a large area of the IDT electrode. This reduces the current densities of the two divided resonators compared with the current density of the foregoing single acoustic wave resonator, and thus it becomes possible to achieve the improvement of electric power handling capability and the reduction or prevention of intermodulation distortion of the acoustic wave filter 1A.

Note that each of the series arm resonators 13A and 13B does not need to be a divided resonator, and the series arm resonators 13A and 13B may have different electrode parameters. Further, another circuit element may be connected to the node that connects the series arm resonator 13A and the series arm resonator 13B, and further, this node may be connected to the ground.

Further, each of the series arm resonators 11, 12, 14, and 15 and the parallel arm resonators 21 to 24 may include a plurality of divided resonators.

Figure 9A:
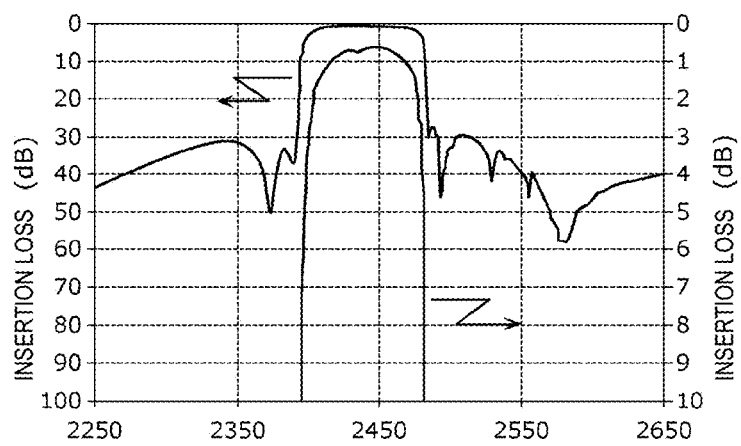
FIGS. 9A and 9B show graphs illustrating a bandpass characteristic of the acoustic wave filter according to the working example and impedance characteristics of series arm resonators thereof.
Figure 9B:
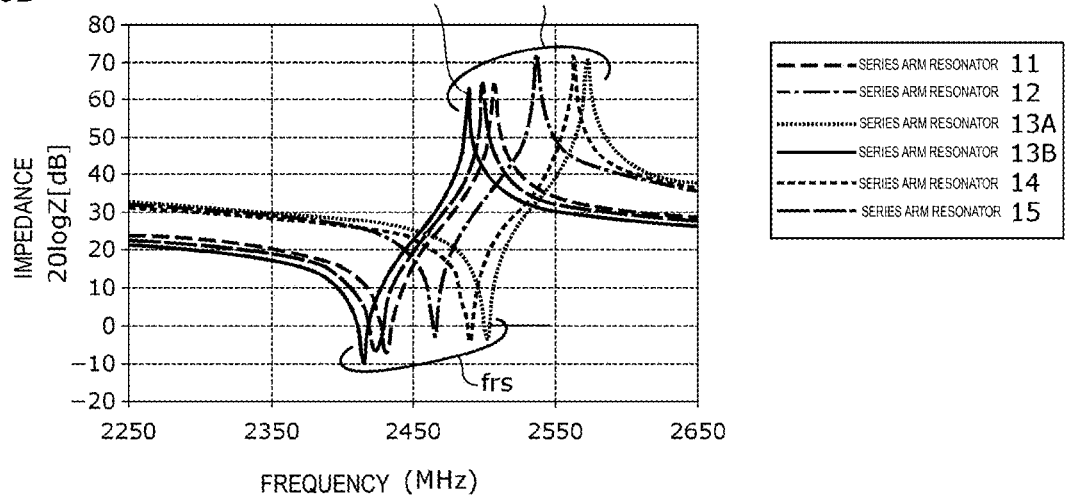

FIGS. 9A and 9B show graphs illustrating the bandpass characteristic of the acoustic wave filter 1A according to the working example (FIG. 9A) and the impedance characteristics of the series arm resonators thereof (FIG. 9B).

As illustrated in FIG. 9B, in the acoustic wave filter 1A according to the present working example, the anti-resonant frequencies fas, where the impedances of the series arm resonators 11, 12, 13A, 13B, 14, and 15 are local maxima, are in the high frequency side stop range.

Here, the anti-resonant frequency fas13B of the series arm resonator 13B is the lowest of the anti-resonant frequencies fas of the plurality of the series arm resonators 11 to 15 that define the acoustic wave filter 1A. Moreover, the series arm resonator 13B includes the IDT electrode including the floating withdrawal electrodes. Further, each of the series arm resonators 11, 12, 13A, 14, and 15 other than the series arm resonator 13B includes the IDT electrode including the polarity-reversing withdrawal electrodes.

Figure 10:
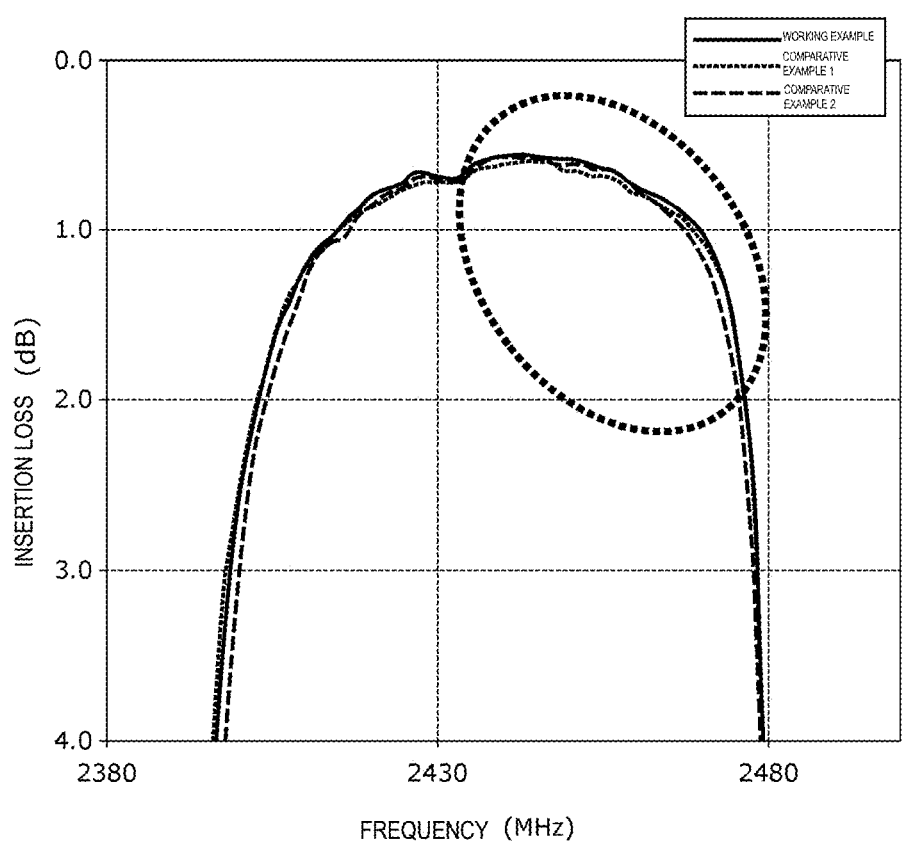
FIG. 10 is a graph comparing insertion losses in pass bands of acoustic wave filters according to the working example, a comparative example 1, and a comparative example 2.

FIG. 10 is a graph comparing insertion losses in pass bands of acoustic wave filters according to the working example, a comparative example 1, and a comparative example 2. Each of the acoustic wave filters according to the comparative example 1 and the comparative example 2 has the same or substantially the same circuit configuration as the circuit configuration of the acoustic wave filter 1 illustrated in FIG. 8 and is different from the acoustic wave filter 1 according to the working example in the configuration of electrode fingers of the withdrawal electrode.

In Table 1, the withdrawal electrode configuration, the insertion loss in the pass band, and the degree of steepness at the high frequency side end portion of the pass band of the acoustic wave filters according to the working example, the comparative example 1, and the comparative example 2 are described.

band (for example, about 2402.5 MHz to about 2471.5 MHz). Further, the degree of steepness on the high frequency side represents the frequency difference between the frequency at which the insertion loss is about 1.6 dB and the frequency at which the insertion loss is about 20 dB in a band on the high frequency side (for example, about 2471.5 MHz to about 2483.5 MHz) above the pass band.

TABLE 1

|  |  | Working example | Comparative example 1 | Comparative example 2 |
|---|---|---|---|---|
| Series arm resonator 11 |  | Polarity-reversing withdrawal electrode | Floating withdrawal electrode | Polarity-reversing withdrawal electrode |
| Series arm resonator 12 |  | Polarity-reversing withdrawal electrode | Floating withdrawal electrode | Polarity-reversing withdrawal electrode |
| Series arm resonator 13A |  | Polarity-reversing withdrawal electrode | Floating withdrawal electrode | Polarity-reversing withdrawal electrode |
| Series arm resonator 13B |  | Floating withdrawal electrode | Floating withdrawal electrode | Polarity-reversing withdrawal electrode |
| Series arm resonator 14 |  | Polarity-reversing withdrawal electrode | Floating withdrawal electrode | Polarity-reversing withdrawal electrode |
| Series arm resonator 15 |  | Polarity-reversing withdrawal electrode | Floating withdrawal electrode | Polarity-reversing withdrawal electrode |
| Parallel arm resonator 21 |  | No withdrawal electrode | No withdrawal electrode | No withdrawal electrode |
| Parallel arm resonator 22 |  | Floating withdrawal electrode | Floating withdrawal electrode | Floating withdrawal electrode |
| Parallel arm resonator 23 |  | Floating withdrawal electrode | Floating withdrawal electrode | Floating withdrawal electrode |
| Parallel arm resonator 24 |  | No withdrawal electrode | No withdrawal electrode | No withdrawal electrode |
| H-ch insertion loss | 2452.5-2471.5 MHz | 0.89 dB | 0.95 dB | 0.97 dB |
| Degree of steepness on High Frequency side | 2471.5-2483.5 MHz | 7.60 MHz | 8.10 MHz | 9.70 MHz |

As illustrated in Table 1, in the acoustic wave filter 1A according to the working example, the series arm resonator 13B includes the floating withdrawal electrodes, and the series arm resonators 11, 12, 13A, 14, and 15 each include the polarity-reversing withdrawal electrodes.

Further, in the acoustic wave filter according to the comparative example 1, each of the series arm resonators 11 to 15 includes the floating withdrawal electrodes. Further, in the acoustic wave filter according to the comparative example 2, each of the series arm resonators 11 to 15 includes the polarity-reversing withdrawal electrodes.

Further, in the acoustic wave filters according to the working example, the comparative example 1, and the comparative example 2, each of the parallel arm resonators 21 and 24 does not include any withdrawal electrode, and each of the parallel arm resonators 22 and 23 includes the floating withdrawal electrodes in common. In the acoustic wave filters according to the working example, the comparative example 1, and the comparative example 2, the parallel arm resonators 21 to 24 may include withdrawal electrodes or do not need to include any withdrawal electrode. Further, the withdrawal electrode structures of the parallel arm resonators 21 to 24 may be any one of the floating withdrawal electrode, the polarity-reversing withdrawal electrode, and the filling withdrawal electrode.

Further, all of the withdrawal ratios of the resonators including the withdrawal electrodes illustrated in Table 1 are about 7%.

Further, in Table 1, the H-ch insertion loss represents the (maximum) insertion loss in a high frequency side band (for example, about 2452.5 MHz to about 2471.5 MHz) of a pass In the acoustic wave filter 1A according to the present working example, compared with the acoustic wave filter according to the comparative example 1, the H-ch insertion loss is reduced by about 0.06 dB, and the degree of steepness on the high frequency side is improved by about 0.5 MHz.

It is interpreted that the insertion loss in the pass band is improved in the acoustic wave filter 1A according to the present working example compared with the acoustic wave filter according to the comparative example 1 because the polarity-reversing withdrawal electrode whose return loss near the resonance point is smaller is used for the series arm resonators 11, 12, 13A, 14, and 15 and not for the series arm resonator 13B that has the lowest anti-resonant frequency.

Further, in the acoustic wave filter 1A according to the present working example, compared with the acoustic wave filter according to the comparative example 2, the H-ch insertion loss is reduced by about 0.08 dB, and the degree of steepness on the high frequency side is improved by about 2.1 MHz.

It is interpreted that the H-ch insertion loss and the degree of steepness on the high frequency side are improved in the acoustic wave filter 1A according to the present working example compared with the acoustic wave filter according to the comparative example 2 because the floating withdrawal electrode whose return loss near the anti-resonance point is smaller is used for the series arm resonator 13B that has the lowest anti-resonant frequency.

With the acoustic wave filter 1A according to the present working example, the floating withdrawal electrode having a smaller Q factor decrease at the anti-resonance point is used for the IDT electrode of the series arm resonator 13B that has the lowest anti-resonant frequency fas among the series arm resonators 11 to 15, and the polarity-reversing withdrawal electrode having a smaller Q factor decrease at the resonance point is used for the other series arm resonators. This improves the steepness on the high frequency side of the pass band by mainly utilizing the resonant characteristic in the vicinity of the anti-resonance point of the series arm resonator 13B and reduces or prevents degradation of the insertion loss in the pass band by utilizing the resonant characteristics in the vicinities of the resonance points of the other series arm resonators. Accordingly, it becomes possible to improve the steepness at the end portion of the pass band of the acoustic wave filter 1A while reducing the insertion loss in the pass band thereof.

In the acoustic wave filter 1A according to the present working example, only at least one of the series arm resonators 11, 12, 13A, 14, and 15 needs to include the polarity-reversing withdrawal electrodes. For example, the series arm resonator 13A may include the polarity-reversing withdrawal electrodes, and the series arm resonators 11, 12, 14, and 15 do not need to include any withdrawal electrode.

According to this, the series arm resonators 11, 12, 14, and 15 do not include any withdrawal electrode, and thus it becomes possible to avoid a decrease in the Q factor at the resonance point and the anti-resonance point. Accordingly, it becomes possible to effectively improve the steepness at the end portion of the pass band of the acoustic wave filter 1A while reducing the insertion loss in the pass band thereof.

Further, at least one of the series arm resonator 11 connected to the input/output terminal 110 and the series arm resonator 15 connected to the input/output terminal 120 may include no withdrawal electrode, and the series arm resonators 12, 13A, 13B, and 14 that are not directly connected to either the input/output terminal 110 or 120 may each include the floating withdrawal electrodes or the polarity-reversing withdrawal electrodes.

Because the input/output terminals 110 and 120 are connected to external circuits, the series arm resonators 11 and 15 each connected to the input/output terminal 110 or 120 need to have impedances that match the external circuits. According to the foregoing configuration, at least one of the series arm resonators 11 and 15 connected to the input/output terminal 110 or 120 does not include any withdrawal electrode, and each of the series arm resonators 12 to 14 that are not connected to either of the input/output terminal 110 or 120 includes the withdrawal electrodes. This enables an IDT electrode design for impedance adjustment and an IDT electrode design for adjustment of the insertion loss and the steepness of the pass band separately. Thus, the flexibility in filter design is improved.

In the acoustic wave filter 1A according to the present working example, the withdrawal ratio of the floating withdrawal electrode of the series arm resonator 13B may be larger than the withdrawal ratios of the polarity-reversing withdrawal electrode of the series arm resonators 11, 12, 13A, 14, and 15.

In the acoustic wave resonator including the floating withdrawal electrodes or the polarity-reversing withdrawal electrodes, as the withdrawal ratio increases, the resonant band width (fractional band), which is the difference between the resonant frequency and the anti-resonant frequency, becomes smaller, and as the withdrawal ratio increases, the Q factors at the resonance point and the anti-resonance point decrease. From this viewpoint, the larger the withdrawal ratio of the series arm resonator 13B is, the smaller the resonant band width of the series arm resonator 13B can be made. Thus, it becomes possible to improve the steepness at the high frequency side end portion of the pass band. Further, the smaller the withdrawal ratios of the series arm resonators 11, 12, 13A, 14, and 15 are, the better the reduction or prevention of the Q factor decrease at the resonance points of these series arm resonators can become. Thus, it becomes possible to reduce or prevent degradation of the insertion loss in the pass band. Accordingly, it becomes possible to improve the steepness at the end portion of the pass band of the acoustic wave filter 1A while reducing the insertion loss in the pass band thereof.

As an acoustic wave filter according to a modified example 3 of the present working example, by optimizing resonant characteristics of the parallel arm resonators 21 to 22 of the acoustic wave filter 1A illustrated in FIG. 8, it becomes possible to improve the steepness at the low frequency side end portion of the pass band of the acoustic wave filter according to the modified example 3 while reducing the insertion loss in the pass band thereof.

Specifically, in the acoustic wave filter according to the modified example 3, the resonant frequency frp22 of the parallel arm resonator 22 is the highest of the resonant frequencies frp of the plurality of the parallel arm resonators 21 to 24 of the acoustic wave filter. Further, the parallel arm resonator 22 includes the polarity-reversing withdrawal electrodes, and the parallel arm resonators 21, 23, and 24 each include the floating withdrawal electrodes.

Note that in this case, it is not necessary for the series arm resonators 11 to 15 to include any withdrawal electrode, and further, there is no limitation on the relative height of frequency among the resonant frequencies and the relative height of frequency among the anti-resonant frequencies of the series arm resonators 11 to 15.

With the acoustic wave filter according to the present modified example, the polarity-reversing withdrawal electrode having a smaller Q factor decrease at the resonance point is used for the IDT electrode of the parallel arm resonator 22 that has the highest resonant frequency frp in the parallel arm resonators 21 to 24, and the floating withdrawal electrode having a smaller Q factor decrease at the anti-resonance point is used for the other parallel arm resonators. This improves the steepness on the low frequency side of the pass band by mainly utilizing the resonant characteristic in the vicinity of the resonance point of the parallel arm resonator 22 and reduces or prevents degradation of the insertion loss in the pass band by utilizing the resonant characteristics in the vicinities of the anti-resonance points of the other parallel arm resonators. Accordingly, it becomes possible to improve the steepness at the end portion of the pass band of the acoustic wave filter while reducing the insertion loss in the pass band thereof.

Note that in the acoustic wave filter according to the present modified example, only at least one of the parallel arm resonators 21, 23, and 24 needs to include the floating withdrawal electrodes. For example, the parallel arm resonator 23 may include the floating withdrawal electrodes, and the parallel arm resonators 21 and 24 may include no withdrawal electrode.

According to this, the parallel arm resonators 21 and 24 do not include any withdrawal electrode, and thus it becomes possible to avoid a decrease in the Q factor at the resonance point and the anti-resonance point. Accordingly, it becomes possible to effectively improve the steepness at the end portion of the pass band of the acoustic wave filter according to the modified example 3 while reducing the insertion loss in the pass band thereof.

Further, in the case where the configuration is such that the parallel arm resonator 21 is directly connected to the input/output terminal 110 or the parallel arm resonator 24 is directly connected to the input/output terminal 120, at least one of the parallel arm resonators 21 and 24 directly connected to the input/output terminal 110 or 120 may include no withdrawal electrode, and the parallel arm resonators 22 and 23 that are not directly connected to either the input/output terminal 110 or 120 may each include the floating withdrawal electrodes or the polarity-reversing withdrawal electrodes.

Because the input/output terminals 110 and 120 are connected to external circuits, the parallel arm resonators 21 and 24 each connected to the input/output terminal 110 or 120 need to have impedances that match the external circuits. According to the foregoing configuration, at least one of the parallel arm resonators 21 and 24 connected to the input/output terminal 110 or 120 does not include any withdrawal electrode, and each of the parallel arm resonators 22 and 23 that are not connected to either the input/output terminal 110 or 120 includes the withdrawal electrodes. This provides an IDT electrode design for impedance adjustment and an IDT electrode design for adjustment of the insertion loss and the steepness of the pass band separately. Thus, the flexibility in filter design is improved.

In the acoustic wave filter according to the modified example 3, the withdrawal ratio of the polarity-reversing withdrawal electrode of the parallel arm resonator 22 may be larger than the withdrawal ratios of the floating withdrawal electrode of the parallel arm resonators 21, 23, and 24.

In the acoustic wave resonator including the floating withdrawal electrodes or the polarity-reversing withdrawal electrodes, as the withdrawal ratio increases, the resonant band width (fractional band), which is the difference between the resonant frequency and the anti-resonant frequency, becomes smaller, and as the withdrawal ratio increases, the Q factors at the resonance point and the anti-resonance point decrease. From this viewpoint, the larger the withdrawal ratio of the parallel arm resonator 22 is, the smaller the resonant band width of the parallel arm resonator 22 can be made. Thus, it becomes possible to improve the steepness at the low frequency side end portion of the pass band. Further, the smaller the withdrawal ratios of the parallel arm resonators 21, 23, and 24 are, the better the reduction or prevention of the Q factor decrease at the resonance points of these parallel arm resonators can become. Thus, it becomes possible to reduce or prevent degradation of the insertion loss in the pass band. Accordingly, it becomes possible to improve the steepness at the end portion of the pass band of the acoustic wave filter according to the modified example 3 while reducing the insertion loss in the pass band thereof.

8. Advantageous Effects

The acoustic wave filter 1 according to the present preferred embodiment includes a plurality of series arm resonators s1 and s2 provided along the path connecting the input/output terminals 110 and 120 and one or more parallel arm resonators p1 and p2 each being provided between a node in the path and the ground, and the series arm resonators s1 and s2 and the parallel arm resonators p1 and p2 each include an acoustic wave resonator including an IDT electrode provided on a substrate having piezoelectricity. The IDT electrode includes a pair of comb-shaped electrodes each including a plurality of electrode fingers and a busbar electrode. Of the foregoing plurality of electrode fingers, the electrode finger that is connected to neither of the busbar electrodes of the pair of comb-shaped electrodes is defined as the floating withdrawal electrode, and of all of the electrode fingers of the pair of comb-shaped electrodes, the electrode finger that is connected to the same busbar electrode to which the electrode fingers on both sides thereof are connected is defined as the polarity-reversing withdrawal electrode. Here, of the series arm resonators s1 and s2, the series arm resonator s1 that has the lowest anti-resonant frequency fas includes the IDT electrode including the floating withdrawal electrodes, and the series arm resonator s2 includes the IDT electrode including the polarity-reversing withdrawal electrodes.

According to this, the floating withdrawal electrode having a smaller Q factor decrease at the anti-resonance point is used for the IDT electrode of the series arm resonator s1 that has the lowest anti-resonant frequency, and the polarity-reversing withdrawal electrode having a smaller Q factor decrease at the resonance point is used for the series arm resonator s2 other than the series arm resonator s1. This improves the steepness on the high frequency side of the pass band by mainly utilizing the resonant characteristic in the vicinity of the anti-resonance point of the series arm resonator s1 and reduces or prevents degradation of the insertion loss in the pass band by utilizing the resonant characteristic in the vicinity of the resonance point of the series arm resonator s2. Accordingly, it becomes possible to improve the steepness at the end portion of the pass band of the acoustic wave filter 1 while reducing the insertion loss in the pass band thereof.

Further, the withdrawal ratio of the series arm resonator s1 may be larger than the withdrawal ratio of the series arm resonator s2 that includes the IDT electrode including the polarity-reversing withdrawal electrodes.

Because of this, the larger the withdrawal ratio of the series arm resonator s1 is, the smaller the resonant band width of the series arm resonator s1 can be made. Thus, it becomes possible to improve the steepness at the high frequency side end portion of the pass band. Further, the smaller the withdrawal ratio of the series arm resonator s2 including the polarity-reversing withdrawal electrodes is, the better the reduction or prevention of the Q factor decrease at the resonance point of the series arm resonator s2 can become. Thus, it becomes possible to reduce or prevent degradation of the insertion loss in the pass band. Accordingly, it becomes possible to improve the steepness at the end portion of the pass band of the acoustic wave filter 1 while reducing the insertion loss in the pass band thereof.

Further, in the acoustic wave filter 1A according to the working example, the series arm resonator 13B includes the IDT electrode including the floating withdrawal electrodes. Of the series arm resonators 13A and 13B, which are a portion of the plurality of series arm resonators 11 to 15, the series arm resonator 13A other than the series arm resonator 13B includes the IDT electrode including the polarity-reversing withdrawal electrodes. Of the plurality of series arm resonators 11 to 15, each of the series arm resonators 11, 12, 14, and 15 other than the series arm resonators 13A and 13B does not need to include any withdrawal electrode.

This improves the steepness on the high frequency side of the pass band by utilizing the resonant characteristic in the vicinity of the anti-resonance point of the series arm resonator 13B and reduces or prevents degradation of the insertion loss in the pass band by utilizing the resonant characteristic in the vicinity of the resonance point of the series arm resonator 13A including the polarity-reversing withdrawal electrodes. Moreover, the series arm resonators 11, 12, 14, and 15 do not include any withdrawal electrode, and thus it becomes possible to avoid a decrease in the Q factor at the resonance point and the anti-resonance point. Accordingly, it becomes possible to effectively improve the steepness at the end portion of the pass band of the acoustic wave filter 1A while reducing the insertion loss in the pass band thereof.

Further, in the acoustic wave filter 1A according to the working example, the series arm resonator 13B may include the IDT electrode including the floating withdrawal electrodes, and of the plurality of series arm resonators 11 to 15, each of the series arm resonators 11, 12, 13A, 14, and 15 other than the series arm resonator 13B may have the IDT electrode including the polarity-reversing withdrawal electrodes.

This improves the steepness on the high frequency side of the pass band by utilizing the resonant characteristic in the vicinity of the anti-resonance point of the series arm resonator 13B and reduces or prevents degradation of the insertion loss in the pass band by utilizing the resonant characteristics in the vicinities of the resonance points of all the series arm resonators 11, 12, 13A, 14, and 15 other than the series arm resonator 13B. Accordingly, it becomes possible to improve the steepness at the end portion of the pass band of the acoustic wave filter 1A while reducing the insertion loss in the pass band thereof.

Further, at least one of the input/output terminals 110 and 120 is connected to, of the series arm resonators 11 to 15, the series arm resonator that does not include any withdrawal electrode, and of the plurality of the series arm resonators 11 to 15, the series arm resonator including the floating withdrawal electrodes or the polarity-reversing withdrawal electrodes does not need to be directly connected to the input/output terminal 110 or 120.

Because of this, the series arm resonator connected to the input/output terminal does not include any withdrawal electrode, and the series arm resonator not connected to the input/output terminal includes the withdrawal electrodes. This enables an IDT electrode design for impedance adjustment and an IDT electrode design for adjustment of the insertion loss and the steepness of the pass band separately. Thus, the flexibility in filter design is improved.

Further, the acoustic wave filter according to the modified example 2 includes a plurality of series arm resonators s1 and s2 provided along the path connecting the input/output terminals 110 and 120 and one or more parallel arm resonators p1 and p2 each being provided between a node in the path and the ground, and the series arm resonators s1 and s2 and the parallel arm resonators p1 and p2 each include an acoustic wave resonator including an IDT electrode provided on a substrate having piezoelectricity. The IDT electrode includes a pair of comb-shaped electrodes each including a plurality of electrode fingers and a busbar electrode. Of the foregoing plurality of electrode fingers, the electrode finger that is connected to neither of the busbar electrodes of the pair of comb-shaped electrodes is defined as the floating withdrawal electrode. Of all of the electrode fingers of the pair of comb-shaped electrodes, the electrode finger that is connected to the same busbar electrode to which the electrode fingers on both sides thereof are connected is defined as the polarity-reversing withdrawal electrode. Here, of the parallel arm resonators p1 and p2, the parallel arm resonator p1 that has the highest resonant frequency frp includes the IDT electrode including the polarity-reversing withdrawal electrodes, and the parallel arm resonator p2 includes the IDT electrode including the floating withdrawal electrodes.

According to this, the polarity-reversing withdrawal electrode having a smaller Q factor decrease at the resonance point is used for the IDT electrode of the parallel arm resonator p1 that has the highest resonant frequency, and the floating withdrawal electrode having a smaller Q factor decrease at the anti-resonance point is used for the parallel arm resonator p2 other than the parallel arm resonator p1. This improves the steepness on the low frequency side of the pass band by mainly utilizing the resonant characteristic in the vicinity of the resonance point of the parallel arm resonator p1 and reduces or prevents degradation of the insertion loss in the pass band by utilizing the resonant characteristic in the vicinity of the anti-resonance point of the parallel arm resonator p2. Accordingly, it becomes possible to improve the steepness at the end portion of the pass band of the acoustic wave filter according to the modified example 2 while reducing the insertion loss in the pass band thereof.

Further, the withdrawal ratio of the parallel arm resonator p1 may be larger than the withdrawal ratio of the parallel arm resonator p2 that includes the IDT electrode including the floating withdrawal electrodes.

Because of this, the larger the withdrawal ratio of the parallel arm resonator p1 is, the smaller the resonant band width of the parallel arm resonator p1 can be made. Thus, it becomes possible to improve the steepness at the low frequency side end portion of the pass band. Further, the smaller the withdrawal ratio of the parallel arm resonator p2 including the floating withdrawal electrodes is, the better the reduction or prevention of the Q factor decrease at the anti-resonance point of the parallel arm resonator p2 can become. Thus, it becomes possible to reduce or prevent degradation of the insertion loss in the pass band. Accordingly, it becomes possible to improve the steepness at the end portion of the pass band of the acoustic wave filter according to the modified example 2 while reducing the insertion loss in the pass band thereof.

Further, in the acoustic wave filter according to the modified example 3, the parallel arm resonator 22 includes the IDT electrode including the polarity-reversing withdrawal electrodes. Of the parallel arm resonators 22 and 23, which are a portion of the plurality of parallel arm resonators 21 to 24, the parallel arm resonator 23 other than the parallel arm resonator 22 includes the IDT electrode including the floating withdrawal electrodes. Of the plurality of parallel arm resonators 21 to 24, each of the parallel arm resonators 21 and 24 other than the parallel arm resonators 22 and 23 does not need to include any withdrawal electrode.

This improves the steepness on the low frequency side of the pass band by utilizing the resonant characteristic in the vicinity of the resonance point of the parallel arm resonator 22 and reduces or prevents degradation of the insertion loss in the pass band by utilizing the resonant characteristic in the vicinity of the anti-resonance point of the parallel arm resonator 23 including the floating withdrawal electrodes. Moreover, the parallel arm resonators 21 and 24 do not include any withdrawal electrode, and thus it becomes possible to avoid a decrease in the Q factor at the resonance point and the anti-resonance point. Accordingly, it becomes possible to effectively improve the steepness at the end portion of the pass band of the acoustic wave filter according to the modified example 3 while reducing the insertion loss in the pass band thereof.

Further, in the acoustic wave filter according to the modified example 3, the parallel arm resonator 22 may include the IDT electrode including the polarity-reversing withdrawal electrodes, and of the plurality of parallel arm resonators 21 to 24, each of the parallel arm resonators 21, 23, and 24 other than the parallel arm resonator 22 may include the IDT electrode including the floating withdrawal electrodes.

This improves the steepness on the low frequency side of the pass band by utilizing the resonant characteristic in the vicinity of the resonance point of the parallel arm resonator 22 and reduces or prevents degradation of the insertion loss in the pass band by utilizing the resonant characteristics in the vicinities of the anti-resonance points of all the parallel arm resonators 21, 23, and 24 other than the parallel arm resonator 22. Accordingly, it becomes possible to improve the steepness at the end portion of the pass band of the acoustic wave filter according to the modified example 3 while reducing the insertion loss in the pass band thereof.

Further, at least one of the input/output terminals 110 and 120 is connected to, of the parallel arm resonators 21 to 24, the parallel arm resonator that does not include any withdrawal electrode, and of the plurality of the parallel arm resonators 21 to 24, the parallel arm resonator including the floating withdrawal electrodes or the polarity-reversing withdrawal electrodes does not need to be directly connected to the input/output terminal 110 or 120.

Because of this, the parallel arm resonator connected to the input/output terminal does not include any withdrawal electrode, and the parallel arm resonator not connected to the input/output terminal includes the withdrawal electrodes. This enables an IDT electrode design for impedance adjustment and an IDT electrode design for adjustment of the insertion loss and the steepness of the pass band separately. Thus, the flexibility in filter design is improved.

Other Modified Examples

The acoustic wave filters according to the foregoing preferred embodiments have been described using the working example and the modified examples. However, acoustic wave filters according to the present invention are not limited to the foregoing working example and modified examples thereof. Other preferred embodiments provided by combining optional elements of the foregoing working example and the foregoing modified examples, modified examples obtained by providing various modifications conceivable to those skilled in the art to the foregoing working example and the foregoing modified examples without departing from the scope of the present invention, and various devices including acoustic wave filters according to the foregoing working example and the foregoing modified examples may also be included in the present invention.

An acoustic wave resonator that defines the acoustic wave filter 1 according to the foregoing preferred embodiment may be, for example, a SAW (Surface Acoustic Wave) resonator described above or a BAW (Bulk Acoustic Wave) resonator. SAW includes not only surface waves but also boundary waves.

Industrial Applicability

Preferred embodiments of the present invention can be widely used in communication devices such as, for example, mobile phones and the like as an acoustic wave filter that has high steepness and can be used for multiband multimode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
   a first input/output terminal and a second input/output terminal;
   a plurality of series arm resonators along a path connecting the first input/output terminal and the second input/output terminal; and
   one or more parallel arm resonators each between a node in the path and ground; wherein
   each of the plurality of series arm resonators and the one or more parallel arm resonators includes an acoustic wave resonator that includes an interdigital transducer (IDT) electrode on a substrate having piezoelectricity;
   the IDT electrode includes a pair of comb-shaped electrodes each including a plurality of electrode fingers and a busbar electrode, the plurality of electrode fingers being in parallel or substantially in parallel to one another and extending in a direction that crosses an acoustic wave propagation direction, the busbar electrode connecting one-end portions of the electrode fingers of the plurality of electrode fingers;
   of the plurality of electrode fingers, an electrode finger not connected to either one of the busbar electrodes of the pair of comb-shaped electrodes is a floating withdrawal electrode; and
   of the plurality of electrode fingers, an electrode finger connected to a same busbar electrode to which electrode fingers on both sides thereof are connected is a polarity-reversing withdrawal electrode;
   of the plurality of series arm resonators, a first series arm resonator having a lowest anti-resonant frequency includes an IDT electrode including the floating withdrawal electrode; and
   of the plurality of series arm resonators, at least one series arm resonator other than the first series arm resonator includes an IDT electrode including the polarity-reversing withdrawal electrode.

2. The acoustic wave filter according to claim 1, wherein a withdrawal ratio of the first series arm resonator is larger than a withdrawal ratio of the at least one series arm resonator that includes the IDT electrode including the polarity-reversing withdrawal electrode.

3. The acoustic wave filter according to claim 1, wherein
   of the plurality of series arm resonators, the first series arm resonator includes the IDT electrode including the floating withdrawal electrode;
   of a portion of the plurality of series arm resonators, each of the series arm resonators other than the first series arm resonator includes the IDT electrode including the polarity-reversing withdrawal electrode; and
   of the plurality of series arm resonators, each of the series arm resonators other than the portion of the plurality of series arm resonators includes no withdrawal electrode.

4. The acoustic wave filter according to claim 1, wherein
   of the plurality of series arm resonators, the first series arm resonator includes the IDT electrode including the floating withdrawal electrode; and
   of the plurality of series arm resonators, all of the series arm resonators other than the first series arm resonator include the IDT electrode including the polarity-reversing withdrawal electrode.

5. The acoustic wave filter according to claim 1, wherein
   at least one of the first input/output terminal and the second input/output terminal is connected to, of the plurality of series arm resonators, a series arm resonator including no withdrawal electrode; and of the plurality of series arm resonators, the series arm resonator including the floating withdrawal electrode or the polarity-reversing withdrawal electrode is not directly connected to either of the first input/output terminal or the second input/output terminal.

6. An acoustic wave filter comprising:
a first input/output terminal and a second input/output terminal;
one or more series arm resonators along a path connecting the first input/output terminal and the second input/output terminal; and
a plurality of parallel arm resonators each between a node in the path and ground; wherein
each of the one or more series arm resonators and the plurality of parallel arm resonators includes an acoustic wave resonator that includes an IDT electrode on a substrate having piezoelectricity;
the IDT electrode includes a pair of comb-shaped electrodes each including a plurality of electrode fingers and a busbar electrode, the plurality of electrode fingers being in parallel or substantially in parallel to one another and extending in a direction that crosses an acoustic wave propagation direction, the busbar electrode connecting one-end portions of the electrode fingers of the plurality of electrode fingers;
of the plurality of electrode fingers, an electrode finger not connected to either one of the busbar electrodes of the pair of comb-shaped electrodes is a floating withdrawal electrode;
of all of the electrode fingers of the pair of comb-shaped electrodes, an electrode finger connected to a same busbar electrode to which electrode fingers on both sides thereof are connected is defined as a polarity-reversing withdrawal electrode;
of the plurality of parallel arm resonators, a first parallel arm resonator having a highest resonant frequency includes an IDT electrode including the polarity-reversing withdrawal electrode; and
of the plurality of parallel arm resonators, at least one of the parallel arm resonators other than the first parallel arm resonator includes an IDT electrode including the floating withdrawal electrode.

7. The acoustic wave filter according to claim 6, wherein a withdrawal ratio of the first parallel arm resonator is larger than a withdrawal ratio of the parallel arm resonator that includes the IDT electrode including the floating withdrawal electrode.

8. The acoustic wave filter according to claim 6, wherein of the plurality of parallel arm resonators, the first parallel arm resonator includes the IDT electrode including the polarity-reversing withdrawal electrode;
of a portion of the plurality of parallel arm resonators, each of the parallel arm resonators other than the first parallel arm resonator includes the IDT electrode including the floating withdrawal electrode; and
of the plurality of parallel arm resonators, each of the parallel arm resonators other than the portion of the plurality of parallel arm resonators includes no withdrawal electrode.

9. The acoustic wave filter according to claim 6, wherein of the plurality of parallel arm resonators, the first parallel arm resonator includes the IDT electrode including the polarity-reversing withdrawal electrode; and
of the plurality of parallel arm resonators, all of the parallel arm resonators other than the first parallel arm resonator includes the IDT electrode including the floating withdrawal electrode.

10. The acoustic wave filter according to claim 6, wherein
at least one of the first input/output terminal and the second input/output terminal is connected to, of the plurality of parallel arm resonators, the parallel arm resonator including no withdrawal electrode; and
of the plurality of parallel arm resonators, the parallel arm resonator including the floating withdrawal electrode or the polarity-reversing withdrawal electrode is not directly connected to either of the first input/output terminal or the second input/output terminal.

11. The acoustic wave filter according to claim 1, wherein a number of the plurality of series arm resonators is three or more.

12. The acoustic wave filter according to claim 1, wherein each of the IDT electrodes includes a close contact layer and a primary electrode layer on the close contact layer.

13. The acoustic wave filter according to claim 12, wherein the close contact layer includes Ti.

14. The acoustic wave filter according to claim 12, wherein a thickness of the close contact layer is about 12 nm.

15. The acoustic wave filter according to claim 12 wherein the primary electrode layer includes Al including about 1% of Cu.

16. The acoustic wave filter according to claim 12 wherein a thickness of the primary electrode layer is about 162 nm.

17. The acoustic wave filter according to claim 6, wherein each of the IDT electrodes includes a close contact layer and a primary electrode layer on the close contact layer.

18. The acoustic wave filter according to claim 17, wherein the close contact layer includes Ti.

19. The acoustic wave filter according to claim 17, wherein a thickness of the close contact layer is about 12 nm.

20. The acoustic wave filter according to claim 17 wherein the primary electrode layer includes Al including about 1% of Cu.

* * * * *